US012713544B2

(12) United States Patent
Liu

(10) Patent No.: US 12,713,544 B2
(45) Date of Patent: Aug. 18, 2026

(54) ELECTRONIC DEVICE

(71) Applicant: Beijing Xiaomi Mobile Software Co., Ltd., Beijing (CN)

(72) Inventor: Zhenhua Liu, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 0 days.

(21) Appl. No.: 18/834,109

(22) PCT Filed: May 26, 2022

(86) PCT No.: PCT/CN2022/095390
§ 371 (c)(1),
(2) Date: Jul. 29, 2024

(87) PCT Pub. No.: WO2023/225969
PCT Pub. Date: Nov. 30, 2023

(65) Prior Publication Data
US 2025/0126726 A1 Apr. 17, 2025

(51) Int. Cl.
*H05K 5/02* (2006.01)
*G06F 1/16* (2006.01)

(52) U.S. Cl.
CPC ......... *H05K 5/0217* (2013.01); *G06F 1/1624* (2013.01); *G06F 1/1652* (2013.01)

(58) Field of Classification Search
CPC ... H05K 5/0217; G06F 1/1624; G06F 1/1637; G06F 1/1652; G06F 1/1677; G06F 1/1686
See application file for complete search history.

(56) References Cited

U.S. PATENT DOCUMENTS 10,904,371 B1 * 1/2021 Song .................... G06F 1/1656
10,955,876 B1 * 3/2021 Song .................... G06F 1/1652
(Continued)

FOREIGN PATENT DOCUMENTS

CN 111768709 A 10/2020
CN 111968503 A 11/2020
(Continued)

OTHER PUBLICATIONS

Extended European Search Report Issued in Application No. 22943169.7 dated Feb. 14, 2025, 8 pages.
(Continued)

*Primary Examiner* — Sagar Shrestha
(74) *Attorney, Agent, or Firm* — Finnegan, Henderson, Farabow, Garrett & Dunner, L.L.P.

(57) ABSTRACT

An electronic device, includes: a housing, including a first housing and a second housing, wherein the first housing and the second housing encircle to define an accommodating structure comprising an opening; a sliding rail mechanism, disposed in the accommodating structure and connected to the second housing, wherein the sliding rail mechanism is slidably connected to the first housing along a first direction; a rotating shaft component, disposed at an end of the second housing away from the first housing, wherein the rotating shaft component comprises a track portion; a thickness of the track portion along a third direction perpendicular to the first direction gradually decreases from an end close to the first housing to an end away from the first housing along the first direction; and a flexible display screen, disposed around the track portion.

15 Claims, 29 Drawing Sheets

(56) References Cited

U.S. PATENT DOCUMENTS

| | | | | |
|---|---|---|---|---|
| 11,497,130 | B2 * | 11/2022 | Song | G06F 1/1652 |
| 11,543,859 | B2 * | 1/2023 | Kwak | H04M 1/0237 |
| 11,815,959 | B2 * | 11/2023 | Kim | G06F 1/1624 |
| 12,477,673 | B2 * | 11/2025 | Lee | C09J 9/00 |
| 2020/0267246 | A1 * | 8/2020 | Song | H05K 1/148 |
| 2021/0385315 | A1 * | 12/2021 | Cha | G06F 1/1637 |
| 2022/0418124 | A1 * | 12/2022 | Liu | H05K 5/0217 |
| 2024/0032214 | A1 * | 1/2024 | Jiang | G09F 9/301 |
| 2025/0168996 | A1 * | 5/2025 | Jia | H05K 5/0217 |

FOREIGN PATENT DOCUMENTS

| | | | |
|---|---|---|---|
| CN | 213368329 | U | 6/2021 |
| CN | 113766048 | A | 12/2021 |
| WO | 2019153257 | A1 | 8/2019 |
| WO | WO 2021/167236 | A1 | 8/2021 |

OTHER PUBLICATIONS

Written Opinion of the International Searching Authority Issued in Application No. PCT/CN2022/095390, Dec. 5, 2022, WIPO, 7 pages.

ISA State Intellectual Property Office of the People's Republic of China, International Search Report issued in Application No. PCT/CN2022/095390, Dec. 5, 2022, WIPO, 4 pages.

State Intellectual Property Office of the People's Republic of China, Office Action and Search Report Issued in Application No. 2022800044943, Dec. 31, 2025, 19 pages.

* cited by examiner

ELECTRONIC DEVICE

CROSS-REFERENCE TO RELATED APPLICATIONS

This application is a U.S. national stage application of International Application No. PCT/CN2022/095390, filed on May 26, 2022, the content of which is hereby incorporated by reference in its entirety.

TECHNICAL FIELD

The present disclosure relates to the technical field of electronic products, and in particular, to an electronic device.

BACKGROUND

With continuous progress of screen technology, mass production of folded flexible display screens and global advent of a 0.01 mm thick flexible display screen make forms of a terminal product more and more abundant, and from smart wearable devices to smart home devices, and then to smart phone terminals, ultra-thin flexible display screens can bring more possible future product designs, such as a foldable mobile phone, an annular mobile phone, a special-shaped surface terminal product, and the like. Meanwhile, arrival of 5G (5-th Generation) enables all intelligent products to be electrically connected, data transmission is accelerated, some modules of intelligent terminal products (such as a photographing module, a BOX acoustic module, and etc.) can be separated from the intelligent terminal products, and functions can still be realized. Battery technology is further developed, and a volume of terminal products is smaller, battery capacity is higher, and a design form of the terminal products is more flexible.

With improvement of requirements of people on flexible display screen products, when different work tasks such as video and call are processed, it is necessary to increase or decrease a display area to improve product experience, and there are mainly two screen extension structures: a foldable screen structure and a stretchable screen structure.

SUMMARY

The present disclosure provides a stretchable screen structure and an electronic device to solve at least some of the problems in the related art.

The present disclosure provides an electronic device to solve at least some of the problems in the related art.

An embodiment of the present disclosure provides an electronic device, including:

- a housing, including a first housing and a second housing, where the first housing and the second housing encircle to define an accommodating structure including an opening;
- a sliding rail mechanism, disposed in the accommodating structure and connected to the second housing, where the sliding rail mechanism is slidably connected to the first housing along a first direction;
- a rotating shaft component, disposed at an end of the second housing away from the first housing, where the rotating shaft component includes a track portion; a thickness of the track portion along a third direction perpendicular to the first direction gradually decreases from an end close to the first housing to an end away from the first housing along the first direction; and

- a flexible display screen, disposed around the track portion, where a first end of the flexible display screen is connected to the sliding rail mechanism, and a second end of the flexible display screen is connected to the first housing and covers the opening.

In some embodiments, the track portion includes a track surface, the flexible display screen is disposed around the track surface, and an end surface of the track surface away from the first housing is an arcuate surface.

In some embodiments, the track portion includes a track body and a rotating wheel, the track body is provided with an accommodating cavity, and the rotating wheel is movably disposed in the accommodating cavity; and

- the flexible display screen is disposed around the track body and a part of the rotating wheel, and an outer contour surface of the track body and a part of an outer contour surface of the rotating wheel form the track surface.

In some embodiments, the track surface is an elliptical surface.

In some embodiments, the electronic device further includes a stretchable screen structure, where the stretchable screen structure includes the flexible display screen and a supporting component;

- where the flexible display screen is provided with a first magnetic component; the supporting component is supported below the flexible display screen, the supporting component includes a first supporting plate and a second supporting plate, where the second supporting plate is connected to the flexible display screen, and is slidably connected to the first supporting plate; at least one of the first supporting plate or the second supporting plate is provided with a second magnetic component engaged with the first magnetic component; and
- the stretchable screen structure includes a stretched state and a retracted state, when the stretchable screen structure switches between the stretched state and the retracted state, the second supporting plate slides relative to the first supporting plate along a direction away from or close to the first supporting plate, the flexible display screen and the second supporting plate move synchronously, and the second supporting plate is configured to support a part of the flexible display screen stretched relative to the first supporting plate.

In some embodiments, the first magnetic component includes:

- a first metal member, connected to a side of the flexible display screen close to the supporting component; and
- a second metal member, connected to the first metal member.

In some embodiments, the flexible display screen includes a body portion and a bending portion connected to the body portion; the first metal member is non-magnetic, and is connected to a side of the body portion and a side of the bending portion close to the supporting component; the second metal member is magnetic, and is connected to a part of the first metal member within a region where the bending portion is located.

In some embodiments, the first metal member includes a mesh metal sheet; and/or, the second metal member includes a strip metal sheet.

In some embodiments, the first supporting plate includes a first body portion and first guiding portions disposed on a side portion of the first body portion, the first guiding portions are arranged to extend along the first direction, and are spaced apart along a second direction perpendicular to the first direction; and the second supporting plate includes a second body portion and second guiding portions slidably engaged with the first guiding portions, the second guiding portions are disposed on a side portion of the second body portion, the second guiding portions are arranged to extend along the first direction, and are spaced apart along the second direction.

In some embodiments, the second magnetic component includes at least one magnetic member, at least one of the second body portion or the second guiding portions is provided with a groove portion, and the magnetic member is provided in the groove portion.

In some embodiments, at least one of: the second body portion is provided with a first groove portion, and the first groove portion is arranged to extend along the first direction; or at least one of the second guiding portions is provided with a second groove portion, and the second groove portion is configured to extend along the second direction.

In some embodiments, the number of magnetic members is multiple;

the second body portion is provided with at least two first groove portions spaced apart along the second direction; or, at least one of the second guiding portions is provided with at least two second groove portions spaced apart along the first direction; or, the second body portion is provided with at least two first groove portions spaced apart along the second direction, and at least one of the second guiding portions is provided with at least two second groove portions spaced apart along the first direction.

In some embodiments, the first guiding portion includes one of a guiding groove or a guiding rail engaged with each other, and the second guiding portion includes the other one of the guiding groove or the guiding rail engaged with each other.

According to the electronic device of the present disclosure, a thickness of the track portion of the rotating shaft component along a third direction perpendicular to the first direction gradually decreases from an end close to the first housing to an end away from the first housing along the first direction. The flexible display screen is disposed around the track portion, where a first end of the flexible display screen is connected to the sliding rail mechanism, and a second end of the flexible display screen is connected to the first housing and covers the opening. In this way, when the flexible display screen moves, the flexible display screen can always be attached to the track portion at a position close to the rotating shaft component, so that a flat display surface can be realized, and a problem of a cambered screen is solved.

It should be understood that the above general description and the following detailed description are exemplary and illustrative only and are not intended to limit the present disclosure.

BRIEF DESCRIPTION OF DRAWINGS

The drawings herein are incorporated in and constitute a part of this specification, illustrating embodiments consistent with the present disclosure and together with the description serve to explain the principles of the present disclosure.

DETAILED DESCRIPTION

Figure 1:
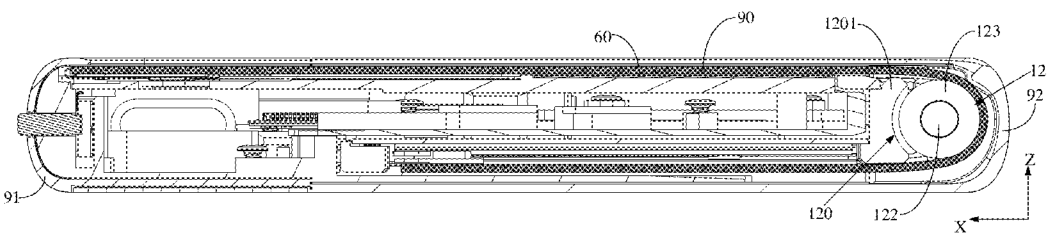
FIG. 1 is a schematic structural diagram of an electronic device in a retracted state according to an exemplary embodiment of the present disclosure.

Exemplary embodiments will be described in detail herein, examples of which are illustrated in the accompanying drawings. The following description relates to the accompanying drawings, in which same numerals indicate same or similar elements unless otherwise indicated. The embodiments described in the following exemplary embodiments do not represent all embodiments consistent with the present disclosure. Rather, they are merely examples of apparatuses and methods consistent with some aspects of the present disclosure as detailed in the appended claims.

The terminology used in the present disclosure is for the purpose of describing particular embodiments only and is not intended to limit the present disclosure. Unless otherwise defined, technical terms or scientific terms used in this disclosure should be of ordinary meaning understood by those of ordinary skills in the art to which the present disclosure belongs. The terms "first", "second" and similar terms used in the specification and claims of the present disclosure do not represent any order, quantity, or importance, but are merely used to distinguish different components. Likewise, words such as "a" or "an" do not indicate a quantity limitation, but indicate that there is at least one. "Multiple" or "a plurality of" means two or more. Unless otherwise indicated, similar terms such as "front," "rear," "lower," and/or "upper" are for ease of illustration and are not limited to one location or one spatial orientation. Similar words such as "comprising" or "including" mean that elements or objects appearing before "comprising" or "including" now encompass elements or objects listed after "comprising" or "including" and equivalents thereof, and do not exclude other elements or objects. The terms "connected to" or "connected with" and the like are not limited to physical or mechanical connections, and may include electrical connections, whether direct or indirect. As used in the present disclosure and the appended claims, the singular forms "a," "the," and "said" are also intended to include multiple forms, unless the context clearly indicates otherwise. It should also be understood that the terms "and/or" as used herein refer to and include any or all possible combinations of one or more associated listed items.

The electronic device of the present disclosure will be described in detail below with reference to the accompanying drawings, and in the case of no conflict, the following embodiments and features in the embodiments may be combined with each other.

Referring to FIG. 1 to FIG. 7, an embodiment of the present disclosure provides an electronic device, which may be a mobile phone, a mobile terminal, a tablet computer, a notebook computer, a terminal handheld device with a screen, a vehicle-mounted display device, and the like. The electronic device may include a stretchable screen structure, a housing, a sliding rail mechanism, a rotating shaft component 12, and a driving mechanism 99. The stretchable screen structure may include a supporting component 60 and a flexible display screen 90.

The flexible display screen 90 is provided with a first magnetic component 40. The supporting component 60 is supported below the flexible display screen 90, the supporting component 60 includes a first supporting plate 61 and a second supporting plate 62, and the second supporting plate 62 is connected to the flexible display screen 90 and slidably connected to the first supporting plate 61. At least one of the first supporting plate 61 and the second supporting plate 62 is provided with a second magnetic component 50 magnetically engaged with the first magnetic component 40.

The stretchable screen structure includes a stretched state and a retracted state, when the stretchable screen structure switches between the stretched state and the retracted state, the second supporting plate 62 slides relative to the first supporting plate 61 along a direction away from or close to the first supporting plate 61, the flexible display screen 90 and the second supporting plate 62 move synchronously, and the second supporting plate 62 is configured to support a part of the flexible display screen 90 stretched relative to the first supporting plate 61.

With this arrangement, the flexible display screen 90 is supported by the supporting component 60, and when the stretchable screen structure is switched between the stretched state and the retracted state, the stretched portion of the flexible display screen 90 relative to the first supporting plate 61 is supported by the second supporting plate 62, so that the flexible display screen 90 is comprehensively supported, a supported area is increased to maximum as much as possible, position distribution of supporting points is as uniform as possible, and a flatness of the supporting component 60 can be controlled below 0.15 in consideration of an issue of parts manufacturing, thereby ensuring that the stretchable screen structure does not recess downward when a finger of a user touches the screen in the stretched state, and improving user experience. In addition, during movement of the flexible display screen 90, the flexible display screen 90 can be flatly attached to the supporting component 60 through magnetic attraction fit of the first magnetic component 40 and the second magnetic component 50, thereby reducing a problem of camber or hollow.

In some implementations, the first magnetic component 40 includes a first metal member 41 and a second metal member 42. The first metal member 41 is connected to a side of the flexible display screen 90 close to the supporting component 60. The second metal member 42 is connected to the first metal member 41. In this way, the first magnetic component 40 is configured as a double-layer metal structure, which can improve magnetic force between the first magnetic component 40 and the second magnetic component 50.

In some implementations, the flexible display screen 90 includes a body portion 903 and a bending portion 904 connected to the body portion 903. The first metal member 41 is non-magnetic, the first metal member 41 is connected to a side of the body portion 903 and a side of the bending portion 904 close to the supporting component 60. It shall be understood that the first metal member 41 covers an entire surface of the flexible display screen 90, so as to facilitate bending of the screen. The second metal member 42 is magnetic, and is connected to a part of the first metal member 41 within a region where the bending portion 904 is located. It can be understood that the second metal member 42 covers the region where the bending portion 904 is located. Optionally, the first metal member 41 may be attached to a side of the body portion 903 and a side of the bending portion 904 close to the supporting component 60 by means of back adhesive. The second metal member 42 may be attached to the part of the first metal member 41 within the region where the bending portion 904 is located by means of back adhesive. Optionally, the first metal member 41 may include a mesh metal sheet. The second metal member 42 may include a strip metal sheet. In the present embodiment, the metal member may adopt a steel sheet, that is, the first metal member 41 may include a mesh steel sheet, and the second metal member 42 may include a strip steel sheet. Certainly, a structure, shape and material of the first metal member 41 and the second metal member 42 may be adjusted according to actual conditions, which is not limited in the present disclosure.

It can be understood that, when the flexible display screen 90 is stretching outwards or retracting inwards, magnetic attraction fit of the first magnetic component 40 and the second magnetic component 50 can make the flexible display screen 90 be flatly attached to the supporting component 60, and a pushing force for pushing the flexible display screen 90 to move is greater than a shearing force of the magnetic attraction, so that the flexible display screen 90 can be flatly attached to the supporting component 60, thereby solving the problem of camber or hollow.

In some embodiments, the first supporting plate 61 includes a first body portion 611 and first guiding portions disposed on a side portion of the first body portion 611, the first guiding portions are arranged to extend along the first direction X, and are spaced apart along a second direction Y perpendicular to the first direction X. The second supporting plate 62 includes a second body portion 621 and second guiding portions slidably engaged with the first guiding portions, the second guiding portions are disposed on a side portion of the second body portion 621, the second guiding portions are arranged to extend along the first direction X, and are spaced apart along the second direction Y.

Optionally, the first guiding portion includes one of a guiding groove 612 or a guiding rail 622 engaged with each other, and the second guiding portion includes the other one of the guiding groove 612 or the guiding rail 622 engaged with each other. In the present embodiment, the first guiding portions include the guiding groove 612, and the second guiding portions include the guiding rail 622. It can be understood that the first supporting plate 61 and the second supporting plate 62 of the supporting component 60 are supported at intervals in phase sequence, similar to a comb or a comb tooth structure of a comb head, and when the second supporting plate 62 slides relative to the first supporting plate 61, a distance between two supporting positions is reduced as much as possible, so that effect of supporting the flexible display screen 90 is better.

Figure 6:
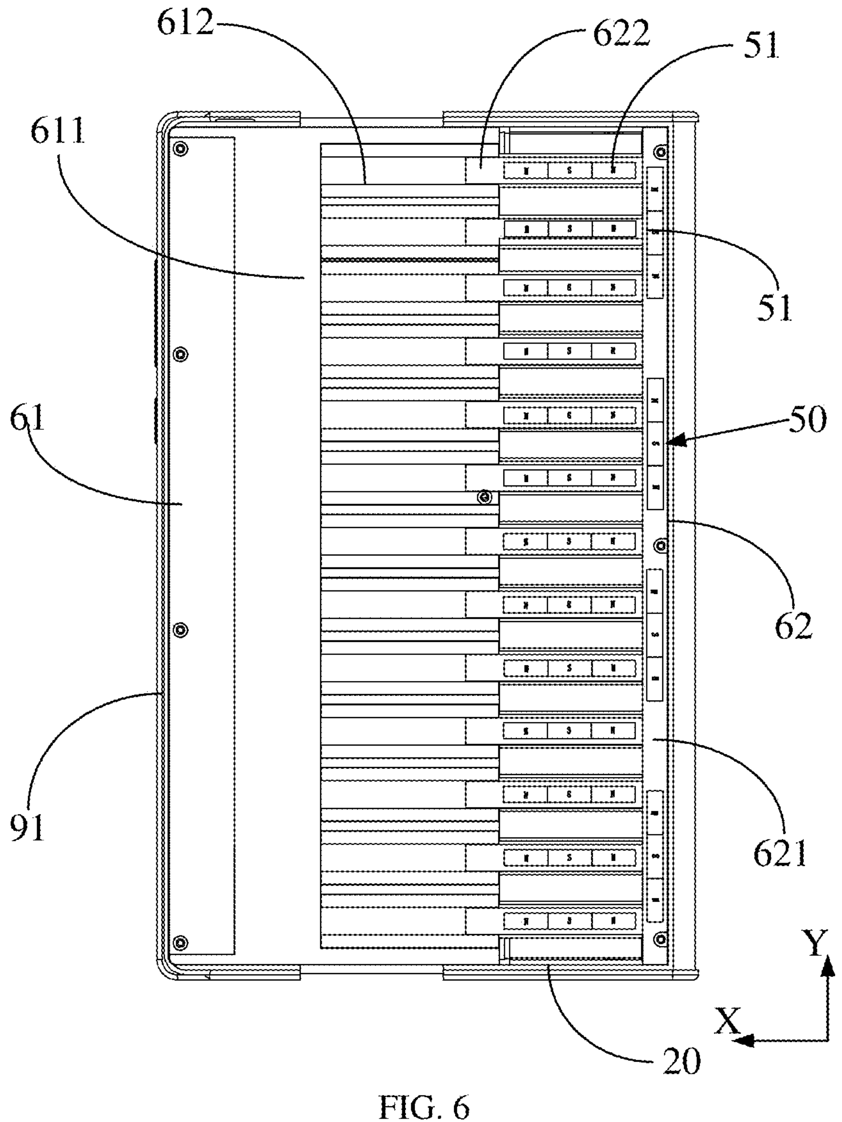
FIG. 6 and FIG. 7 are schematic structural diagrams of a supporting component in a stretched state according to an exemplary embodiment of the present disclosure.
Figure 7:
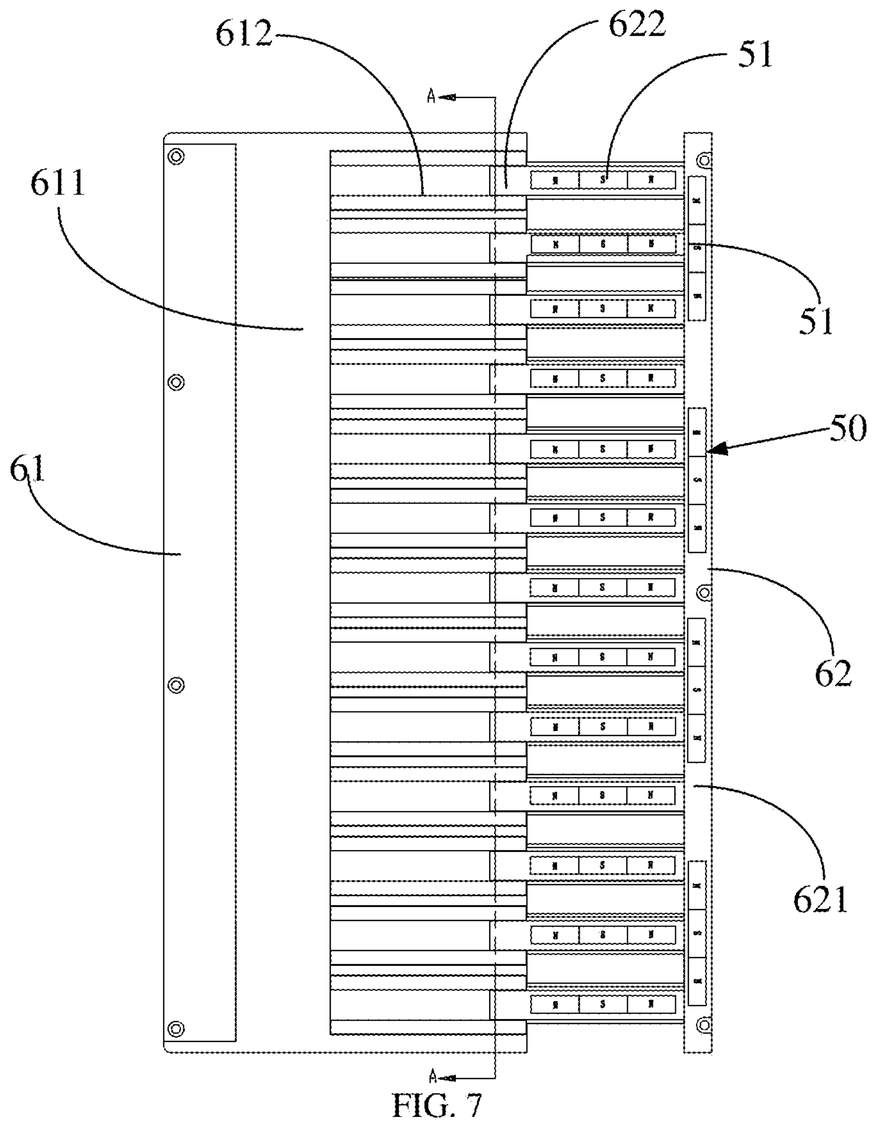
Figure 8A:
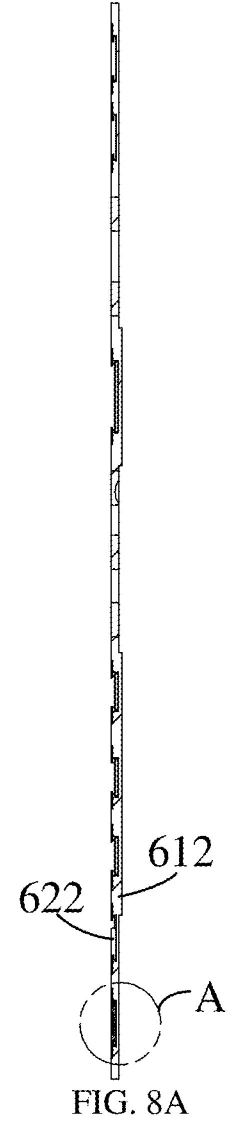
FIG. 8A is a cross-sectional view along plane A-A of FIG. 7.
Figure 8B:
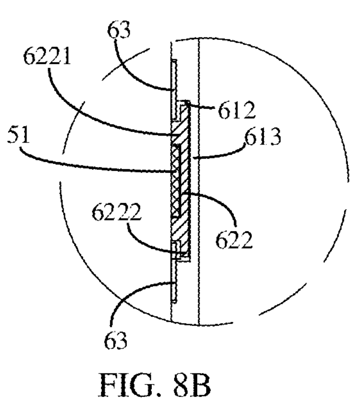
FIG. 8B is an enlarged schematic diagram of part A in FIG. 8.

As shown in FIG. 6, FIG. 8A and FIG. 8B, in some embodiments, the second magnetic component 50 includes at least one magnetic member 51, at least one of the second body portion 621 or the second guiding portions is provided with a groove portion 52, and the magnetic member 51 is provided in the groove portion 52, so that the magnetic member 51 is installed more firmly. Optionally, the magnetic member 51 may be fixed in the groove portion 52 by using spot glue, so as to enhance connection strength with the groove portion 52. Further, the magnetic member 51 may adopt a magnet, and a front surface and a back surface are N/S poles. The magnet may be designed in segments, it might be that N poles of all magnets facing the flexible display screen 90, or S poles of all magnets facing the flexible display screen 90, or N poles of some magnets facing the flexible display screen 90 and S poles of other magnets facing the flexible display screen 90. The magnet may also be configured in a way that N/S poles face toward the flexible display screen 90 in an interlaced way. For example, an N pole of a first magnet faces the flexible display screen 90, an S pole of a second magnet faces the flexible display screen 90, and an N pole of a third magnet faces the flexible display screen 90, and so on. In this way, a magnetic attraction force is greatly increased.

In some embodiments, the second body portion 621 is provided with a first groove portion (not shown), and the first groove portion is arranged to extend along the first direction X. The second guiding portion(s) is/are provided with a second groove portion (not shown), and the second groove portion is configured to extend along the second direction Y. It may be understood that the magnetic member 51 may be independently disposed in the first groove portion. Alternatively, the magnetic member 51 may be independently disposed in the second groove portion. Alternatively, the magnetic member 51 may be disposed in both of the first groove portion and the second groove portion. In the present embodiment, the magnetic member 51 is disposed in both of the first groove portion and the second groove portion. Certainly, a disposing manner of the magnetic member 51 can be adjusted according to actual circumstances, which is not limited by the present disclosure.

In some embodiments, the number of magnetic members 51 is multiple. (1) the second body portion may be independently provided with at least two first groove portions spaced apart along the second direction Y, and the magnetic member 51 is disposed in the first groove portions. Alternatively, (2) at least one of the second guiding portions may be independently provided with at least two second groove portions spaced apart along the first direction X, and the magnetic member 51 is disposed in the second groove portions. Alternatively, (3) the second body portion 621 is provided with at least two first groove portions spaced apart along the second direction Y, and at least one of the second guiding portions is provided with at least two second groove portions spaced apart along the first direction X, and the magnetic member 51 is disposed in both of the first groove portion and the second groove portion. In the present embodiment, the magnetic member 51 adopts the above disposing manner (3). Certainly, a disposing manner of the magnetic member 51 can be adjusted according to actual circumstances, which is not limited by the present disclosure.

Referring to FIG. 9 to FIG. 13, in some implementations, the sliding rail mechanism includes a bracket 11 and a sliding rail component 20, where the sliding rail component 20 includes a fixing base 21, a sliding member 22 configured to be connected to the flexible display screen 90 of the stretchable screen structure, and an elastic component 23. The fixing base 21 is fixed to the bracket 11, the sliding member 22 slides along the first direction X (a vertical direction shown in FIG. 11) and is disposed on the fixing base 21, a first end 2301 of the elastic component 23 is connected to the fixing base 21, and a second end 2302 of the elastic component 23 is connected to the sliding member 22. When the sliding member 22 slides along the first direction X relative to the fixing base 21, the second end of the elastic component 23 and the flexible display screen 90 are driven to move together. The elastic component 23 is driven by the sliding member 22 to be stretched or compressed to deform, thereby generating a pre-pulling force on the flexible display screen 90. It can be understood that the sliding member 22 slides relative to the fixing base 21 in an arrow direction in FIG. 11, and the elastic component 23 is stretched to generate a reverse pulling force.

Through the above arrangement, the sliding member 22 moves relative to the fixing base 21 along the first direction X, so as to drive the flexible display screen 90 of the stretchable screen structure to move together, thereby realizing stretching and retracting of the flexible display screen 90. The sliding member 22 drives the elastic component 23 to move together, so as to stretch the elastic component 23, and generate a pre-pulling force on the flexible display screen 90, so that the flexible display screen 90 is flatter when stretched, thereby preventing problems such as visual screen bulging, bulging and camber when the whole device slides to stretched.

In some implementations, the sliding rail component 20 further includes at least one guiding rail 24, the guiding rail 24 is disposed on the fixing base 21 and extends along the first direction X, the sliding member 22 is provided with a sliding groove 220 corresponding to the guiding rail 24, and the sliding member 22 is slidably disposed on the guiding rail 24 through the sliding groove 220. In the present embodiment, there are four guiding rails 24 symmetrically disposed on the fixing base 21, to cause the sliding member 22 to slide more smoothly. In other embodiments, there may be another number of guiding rails 24, which is not limited in the present disclosure.

In some implementations, the sliding rail component 20 further includes at least one limiting stop 25 disposed at an end of the fixing base 21 away from the bracket 11 (an upper end in FIG. 11), and the sliding member 22 is provided with a limiting portion 221 in abutting fit with the limiting stop 25. The limiting stop 25 abuts against the limiting portion 221 of the sliding member 22 to limit a starting position of the sliding member 22, or prevent the sliding member 22 from separating from the guiding rail 24. In the present embodiment, the limiting portion 221 may be understood as a groove, a number of limiting stops 25 is two, the limiting stops 25 are symmetrically disposed on the fixing base 21, a number of limiting portions 221 is two, and the limiting portions 221 are disposed corresponding to the limiting stops 25, which is not limited in the present disclosure. In an example shown in FIG. 11, the limiting stop 25 is disposed at an upper end of the fixing base 21, the starting position of the sliding member 22 is located at the upper end of the fixing base 21, and in this state, the elastic component 23 applies an elastic pre-pulling force to the sliding member 22, thereby keeping the sliding member 22 at the starting position.

Figure 12:
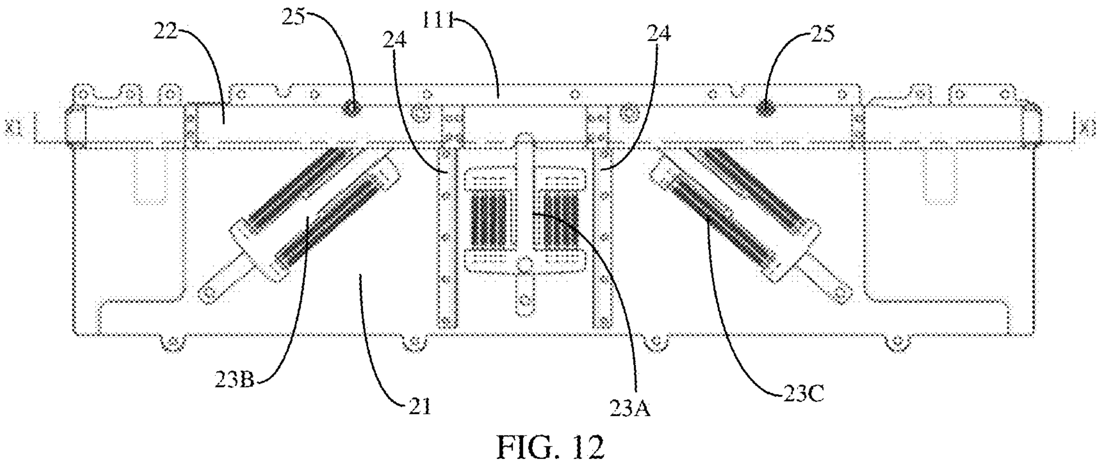
FIG. 12 is a schematic structural diagram of a sliding rail component of a sliding rail mechanism according to an exemplary embodiment of the present disclosure.
Figure 13:
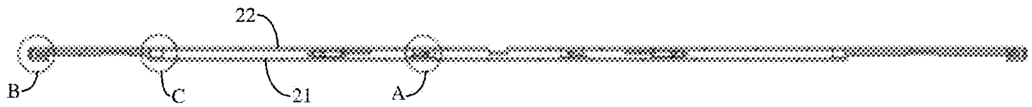
FIG. 13 is a sectional view along direction X1-X1 of FIG. 12.
Figure 14:
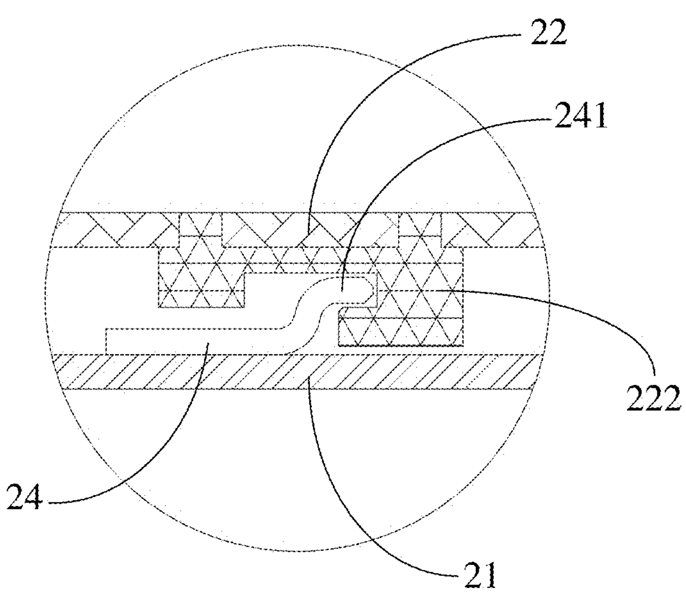
FIG. 14 is a partially enlarged schematic diagram of part A in FIG. 13.

Referring to FIG. 12 to FIG. 14, in some implementations, at least one side portion of the guiding rail 24 is provided with a snapping portion 241, and the sliding member 22 is provided with a first snapped portion 222 snapped with the snapping portion 241. The sliding member 22 is in snapping fit with the snapping portion 241 of the guiding rail 24 through the first snapped portion 222, by which the sliding member 22 can be more firmly connected with the guiding rail 24, so that the sliding member 22 slides along the guiding rail 24 more stably. It can be understood that the snapping portion 241 may be a barb structure formed by machining a sheet metal member, to prevent the sliding member 22 from moving away from the guiding rail 24. In the present embodiment, both sides of the guiding rail 24 are provided with the snapping portions 241, which is not limited in the present disclosure.

Figures 15, 16:
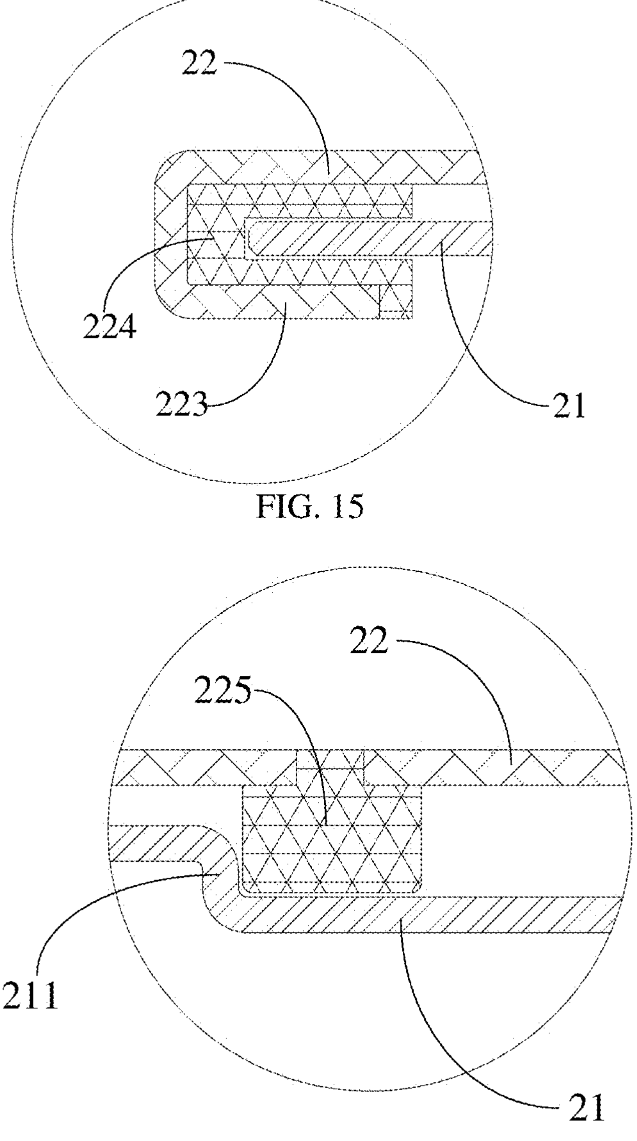
FIG. 15 is a partially enlarged schematic diagram of part B in FIG. 13.
FIG. 16 is a partially enlarged schematic diagram of part C in FIG. 13.

Referring to FIG. 15, in some implementations, a side portion of the sliding member 22 is provided with a second snapped portion 223 snapped with a side edge of the fixing base 21. The sliding member 22 is snapped with the side edge of the fixing base 21 through the second snapped portion 223, so that the connection between the sliding member 22 and the fixing base 21 is more stable, the sliding member 22 is prevented from being separated from the fixing base 21 during sliding, and the stability of the sliding member 22 during sliding is improved. Further, the sliding rail component 20 further includes a plastic snap 224 covering and snapped with the side edge of the fixing base 21, and the second snapped portion 223 is snapped with the plastic snap 224. The plastic snap 224 can reduce a friction force between the second snapped portion 223 and the side edge of the fixing base 21, and reduce wear to ensure smooth sliding. In the present embodiment, the plastic snap 224 may be made of POM (Polyoxymethylene) plastic, which is a self-lubricating plastic. The sliding member 22 and the plastic snap 224 may be combined together as one member by a common-mode insert molding process, and a designed gap between the plastic snap 224 and the side edge of the fixing base 21 is 0.05, so as to ensure that the sliding member 22 can only slide along the extending direction of the guiding rail 24 (i.e., the first direction X), thereby improving structural stability.

As shown in FIG. 16, in some implementations, the fixing base 21 is provided with a step portion 211 extending along the first direction X, the sliding member 22 is provided with an abutting block 225 in abutting fit with the step portion 211, and the abutting fit between the abutting block 225 and the step portion 211 can further prevent the sliding member 22 from moving away from the fixing base 21 when the sliding member 22 slides.

Figure 17:
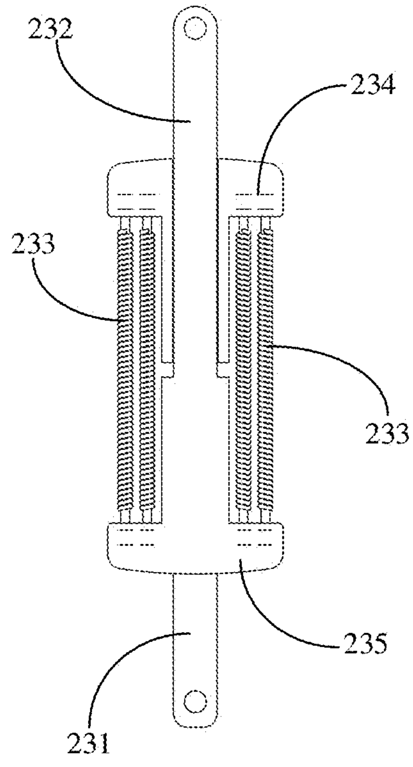
FIG. 17 is a schematic structural diagram of an elastic component of a sliding rail mechanism according to an exemplary embodiment of the present disclosure.

Referring to FIG. 17, in some implementations, the elastic component 23 includes a first rod 231, a second rod 232, and an elastic member 233, the first rod 231 and the second rod 232 are inserted into each other and are slidable, and the elastic member 233 is connected between the first rod 231 and the second rod 232. The first rod 231 is connected to the fixing base 21, and the second rod 232 is connected to the sliding member 22. The elastic member 233 may be a pushing-spring or a pulling-spring and the like, and may have a pre-tension when assembled, so as to maintain the sliding member 22 in a starting position. When the first rod 231 and the second rod 232 are pulled apart, the spring starts to work. When the sliding member 22 slides relative to the fixing base 21, the second rod 232 is driven to slide relative to the first rod 231, so as to cooperate with the first rod 231 to stretch or compress the elastic member 233, so that the elastic member 233 deforms to generate an elastic force on the sliding member 22.

Further, both the first rod 231 and the second rod 232 are provided with sliding grooves, which are inserted into each other and can slide relative to each other. A first end (a lower end shown in FIG. 17) of the first rod 231 is fixed to the fixing base 21 by a rivet, a first end (an upper end shown in FIG. 17) of the second rod 232 is fixed to the sliding member 22 by a rivet, a second end of the first rod 231 protrudes outward to form a first protrusion 234, a second end of the second rod 232 protrudes outward to form a second protrusion 235, and the number of elastic members 233 is multiple, and the elastic members 233 are uniformly arranged between the first protrusion 234 and the second protrusion 235, so that sufficient elastic force can be provided. When the sliding member 22 slides relative to the fixing base 21, the second rod 232 is driven to slide relative to the first rod 231, so as to cooperate with the first rod 231 to stretch the elastic member 233, so that the elastic member 233 deforms to generate a reverse pulling force on the sliding member 22, thereby ensuring that the flexible display screen is in a “tensioned” state.

In some implementations, the number of elastic components 23 is multiple, including a first elastic component 23A, a second elastic component 23B and a third elastic component 23C, where the second elastic component 23B and the third elastic component 23C are symmetrically disposed on two sides of the first elastic component 23A. The elastic member 233 of the first elastic component 23A extends along the first direction X, and the elastic members 233 of the second elastic component 23B and the third elastic component 23C are symmetrically arranged along the first direction X and are obliquely arranged relative to the first direction X.

Due to limited space, it is difficult for a single guiding rail to have such a large elastic stroke. Through the above arrangement, the three elastic components may form a relay form to improve the sliding stroke of the elastic component, where the second elastic component 23B and the third elastic component 23C are of the same design and are symmetrically arranged on both sides of the first elastic component 23A, and an initial compression of the elastic member of the first elastic component 23A may be slightly larger than an initial compression of the elastic members of the second elastic component 23B and the third elastic component 23C, thereby improving larger sliding stroke. Assuming that a designed total sliding stroke is 30.00 mm, the first elastic component 23A may start working when the sliding member 22 slides by 19 mm.

In some embodiments, the entire sliding rail component 20 may be fixed to the bracket 11 by riveting. One end of the bracket 11 may include a connecting plate 111, the fixing base 21 may be made by stamping a metal plate, and may be fixed to the connecting plate 111 through a riveting process. The flexible display screen 90 is fixed on the sliding member 22 of the sliding rail component 20. The bracket 11 may be made of aluminum alloy to improve structural strength. The sliding member 22 may be manufactured by using an SUS stainless steel plate and a POM (Polyoxymethylene) plastic common-mode insert molding process. The stainless steel plate can serve as a main body to play a role in supporting strength, and a sliding groove can be formed by insert molding of POM plastic and can slide with the fixing base 21 and the guiding rail 24 to reduce friction. The limiting stop 25 may be made of plastic, and may limit a starting position of the sliding member 22, and may prevent the sliding member 22 from moving away from the guiding rail 24. The guiding rail 24 may be formed by a stainless steel stamping process and fixed on the fixing base 21 by spot welding. The guiding rail 24 cooperates with the sliding groove 220 on the sliding member 22 to form a barb structure, so as to prevent the sliding member 22 from moving away from the guiding rail 24 when sliding. An exposed surface of the sliding member 22 may serve as an adhesive region 226 to be adhered and fixed to the flexible display screen 90.

Figure 9:
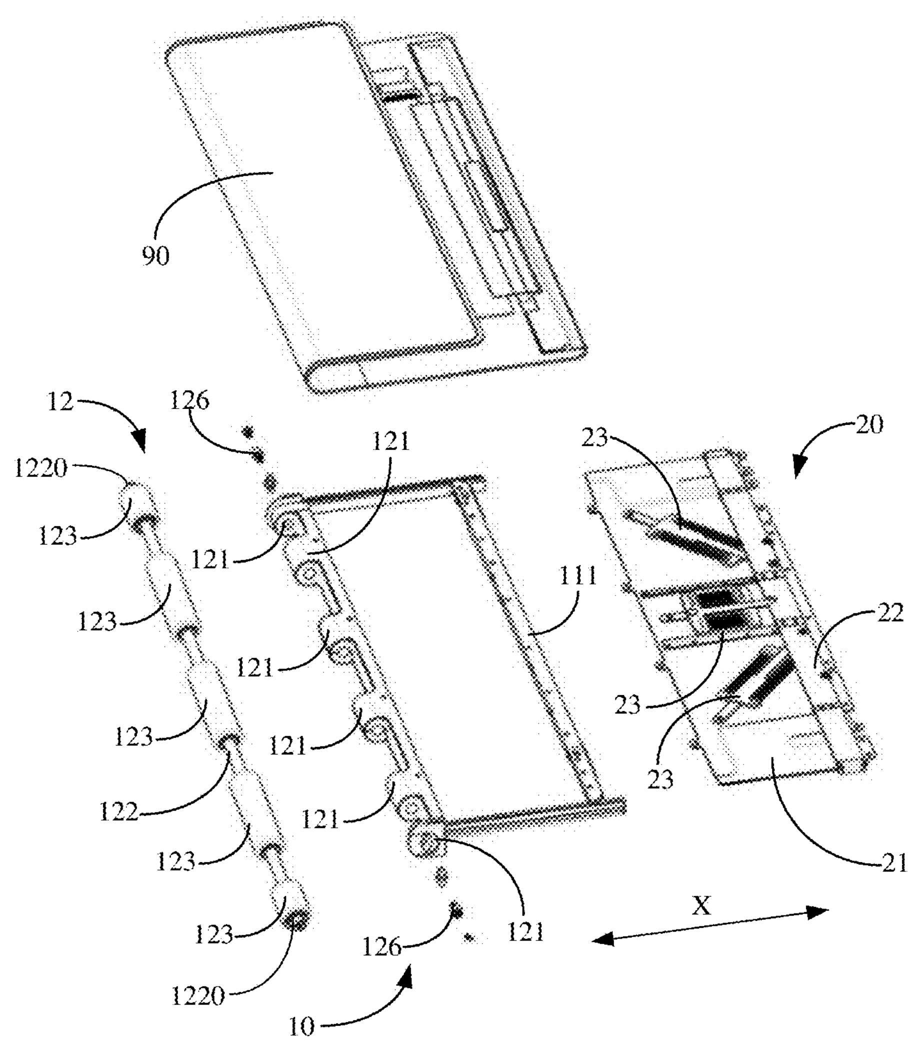
FIG. 9 is an exploded diagram of a stretchable screen structure according to an exemplary embodiment of the present disclosure.
Figure 10:
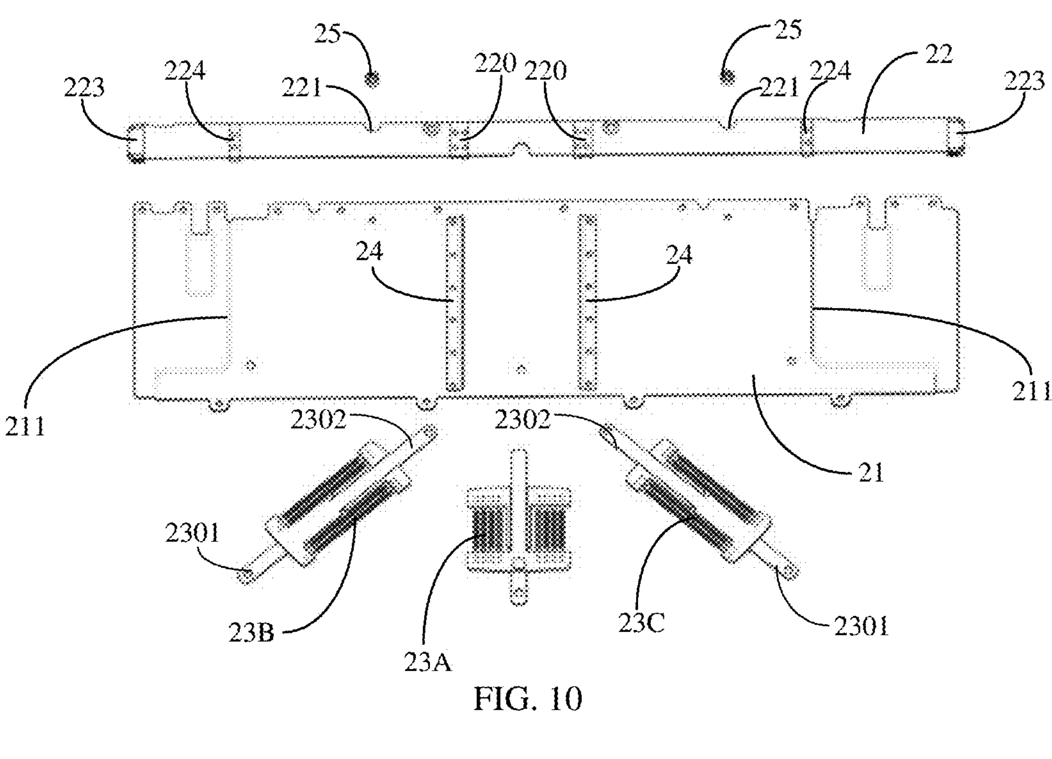
FIG. 10 is a schematic exploded diagram of a sliding rail component of a sliding rail mechanism according to an exemplary embodiment of the present disclosure.
Figure 11:
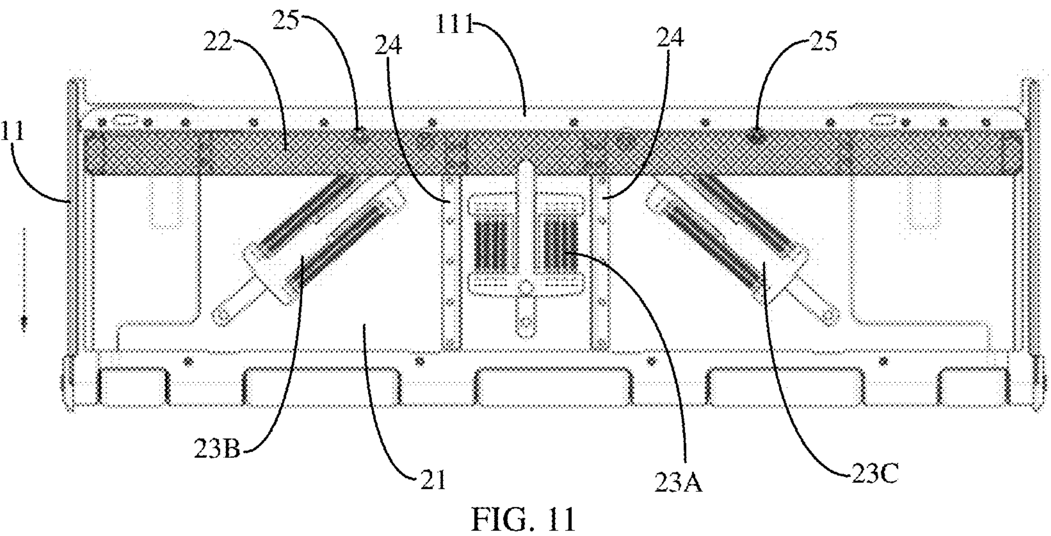
FIG. 11 is a schematic structural diagram of a sliding rail mechanism according to an exemplary embodiment of the present disclosure.
Figure 18:
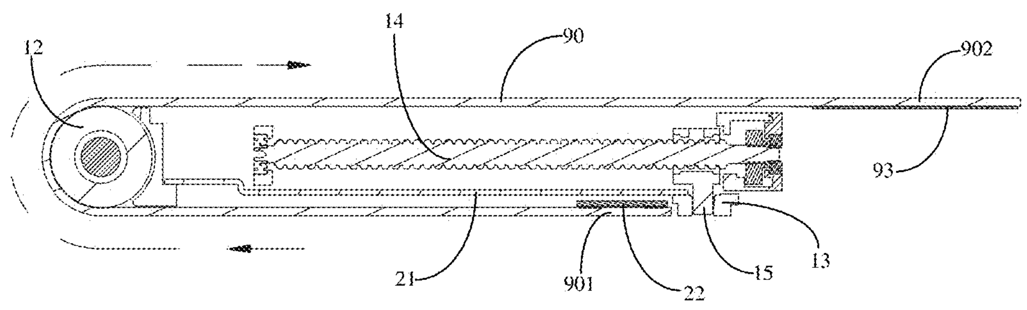
FIG. 18 is a schematic structural diagram of a stretchable screen structure according to an exemplary embodiment of the present disclosure.

Referring to FIG. 9 and FIG. 18, an embodiment of the present disclosure provides a stretchable screen structure, including the sliding rail mechanism and the flexible display screen 90 described in the above embodiments. The rotating shaft component 12 is disposed on a side of the bracket 11 away from the sliding rail component 20, and an axial direction of the rotating shaft component 12 is perpendicular to the first direction X. A first end of the flexible display screen 90 is connected to the sliding member 22, and a second end of the flexible display screen 90 is disposed around the rotating shaft component 12.

The rotating shaft component 12 includes a rotating shaft support, a rotating shaft 122 and a rotating wheel, the rotating shaft support is connected to a side of the bracket 11 away from the sliding rail component 20, the rotating shaft support is provided with a shaft hole, and a circumferential direction of the shaft hole is perpendicular to the first direction X. The rotating shaft 122 passes through the shaft hole, and the rotating wheel is sleeved on the rotating shaft 122. The flexible display screen 90 is disposed around the rotating wheel, and when the flexible display screen 90 is stretched or retracted, the rotating wheel is driven to rotate. It can be understood that a first end 901 of the flexible display screen 90 is connected to the sliding member 22 of the sliding rail component 20, and a second end 902 of the flexible display screen 90 is disposed around the rotating wheel. In this embodiment, the flexible display screen 90 is formed by attaching a flexible OLED (organic light-emitting diode) screen to a thin stainless steel mesh, which has great flexibility.

Through the above arrangement, the flexible display screen 90 is disposed around the rotating wheel of the rotating shaft component 12, and when the flexible display screen 90 is stretched or retracted, the rotating wheel is driven to rotate, that is, the rotating wheel passively rotates, the rotating wheel can play a role of a pulley, so that the flexible display screen 90 is stretched and retracted more smoothly, a friction force and energy loss in the stretching or retracting process of the flexible display screen 90 are effectively reduced, and the flexible display screen 90 can be stretched or retracted more smoothly.

In some implementations, the rotating shaft 122 is fixedly connected to the shaft hole, and the rotating wheel is rotatably connected to the rotating shaft 122. It can be understood that the rotating shaft 122 is fixedly connected to the rotating shaft support, the rotating wheel is rotatable relative to the rotating shaft 122, and the rotating shaft does not rotate relative to the rotating shaft support. When the flexible display screen 90 is stretched or retracted, only the rotating wheel is driven to rotate.

Figure 19:
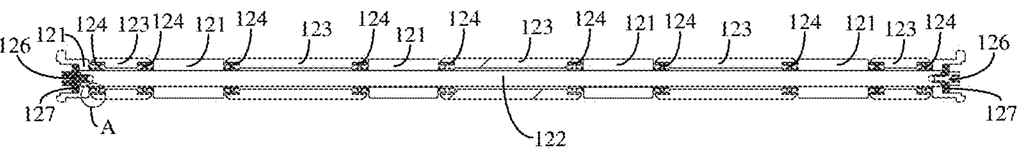
FIG. 19 is a schematic structural diagram of a rotating shaft component of a stretchable screen structure according to an exemplary embodiment of the present disclosure.

Referring to FIG. 9 and FIG. 19, in some implementations, the rotating shaft support includes a plurality of sub-supports 121, the plurality of sub-supports 121 are disposed on the bracket 11 at intervals in a direction perpendicular to the first direction X, the plurality of sub-supports 121 are provided with sub-shaft holes, the sub-shaft holes of the plurality of sub-supports 121 are coaxially disposed to form the shaft hole, and the rotating shaft 122 penetrates through the plurality of sub-shaft holes to be fixedly connected to the plurality of sub-supports 121. The rotating wheel includes a plurality of sub-wheels 123, and one sub-wheel 123 is disposed between every two adjacent sub-supports 121. It can be understood that the rotating shaft support is arranged as a plurality of sub-supports 121, the rotating wheel is arranged as a plurality of sub-rotating wheels 123, and the sub-supports 121 and the sub-rotating wheels 123 are alternately arranged, so that a strength of the rotating shaft support can be enhanced while rotating performance of the rotating wheel is ensured, and an overall structural strength is improved. It may be understood that each sub-support 121 of the rotating shaft support is fixedly connected to the bracket 11, or may be integrally formed with the bracket 11. It should be noted that sizes of the sub-supports 121 may be different, for example, the sub-supports 121 may be divided into small supports and large supports, the sub-supports located on two sides are small supports, and the sub-supports located in the middle are large supports. Sizes of the sub-rotating wheels 123 may also be different, for example, the sub-rotating wheels 123 are divided into large rotating wheels and small rotating wheels, which may be set according to actual needs, which is not limited in the present disclosure.

In some implementations, the rotating shaft component 12 further includes a plurality of first bearings 124 sleeved on the rotating shaft 122, and one first bearing 124 is disposed on two sides of each sub-rotating wheel 123. The first bearing 124 includes a bearing cone and a bearing cup rotatably connected to the bearing cone, the bearing cone is connected to the rotating shaft 122, and the bearing cup is connected to the sub-rotating wheel 123. It can be understood that the sub-rotating wheel 123 rotates relative to the rotating shaft 122 through the first bearing 124, the first bearing 124 can reduce a friction loss caused by the rotation of the sub-rotating wheel 123, and the bearing cone and the rotating shaft 122 can be designed to be zero-engaging in a radial direction to ensure that the bearing cone does not rotate with the rotation of the sub-rotating wheel 123. The sub-rotating wheel 123 and the rotating shaft 122 may be of an avoidance design in a radial direction, to ensure that there is a gap between the sub-rotating wheel 123 and the rotating shaft 122 to implement rotation.

Figure 20:
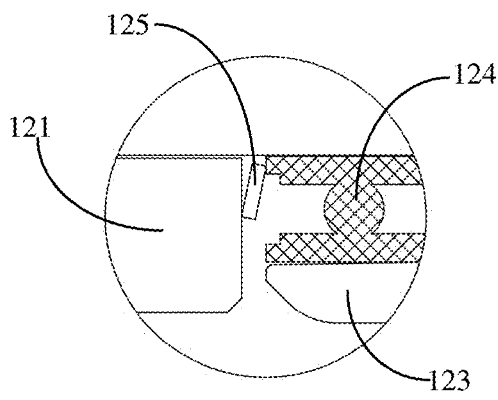
FIG. 20 is an enlarged schematic diagram of part A in FIG. 19.

Referring to FIG. 20, in order to prevent the bearing cone from rotating along with the rotation of the sub-rotating wheel 123, that is, to ensure that the bearing cone does not rotate relative to the rotating shaft 122, the rotating shaft component 12 further includes a plurality of bearing gaskets 125 sleeved on the rotating shaft 122, and one bearing gasket 125 is disposed on a side portion of each first bearing 124. One end of the bearing gasket 125 abuts against the bearing cone, and the other end of the bearing gasket 125 abuts against an adjacent sub-support 121, so that the bearing cone and the adjacent sub-support 121 can be pressed against each other to prevent the bearing cone from rotating along with the rotation of the sub-rotating wheel 123, thereby ensuring that the bearing cone does not rotate relative to the rotating shaft 122. In this way, the rotation of the sub-rotating wheel 123 completely depends on the bearing cup, and the friction loss is low.

Optionally, in some implementations, the bearing gasket 125 is made of a copper material or a stainless steel metal, the cross section of the bearing gasket 125 is of a bowl-shaped structure and has a mechanical property that can be slightly compressed in a thickness direction, a bottom end of the bowl-shaped structure abuts against the bearing cone, and a bowl mouth end of the bowl-shaped structure abuts against the adjacent sub-support 121, so that the bearing cone and the adjacent sub-support 121 are pressed against each other.

In some implementations, the rotating shaft component 12 further includes two groups of first fasteners 126, one end of the rotating shaft 122 is fixedly connected to the rotating shaft support through one group of the first fasteners 126, and the other end is fixedly connected to the rotating shaft support through the other group of the first fasteners 126. It can be understood that the first fasteners 126 pass through the outermost sub-support 121 and is fixedly connected to an end of the rotating shaft 122, thereby fixing the rotating shaft 122 to the rotating shaft support. Optionally, a gasket 127 is further provided between the first fastener 126 and the rotating shaft support. The first fastener 126 may be a dual screw, and the gasket 127 is disposed between the first fastener 126 and the outermost sub-support 121, so that the connection between the rotating shaft 122 and the rotating shaft support can be firmer. Further, the gap between the sub-support 121 and the bearing cone may be set to be in zero-engagement or slight interference (depending on a size of the material and parts), so that a locking force generated by two ends of the dual screw causes a pressure between the bearing gasket 125 and the bearing cone, and the pressure can ensure that the bearing cone does not rotate relative to the rotating shaft 122.

In this embodiment, the sub-rotating wheel 123 may be formed by insert molding of engineering plastic POM, the first bearing 124 can be place through a through hole in the middle and grooves at two ends, and the sub-rotating wheel 123 may be sleeved on the rotating shaft 122, and may passively rotate through the first bearing 124 after assembly. The rotating shaft 122 may adopt a D-shaped shaft, and a main function of the cross section being D-shaped is to fix the bearing cone to prevent the bearing cone from rotating relative to the rotating shaft. The rotating shaft 122 may be made of stainless steel and is disposed through the plurality of sub-supports 121. Two ends of the rotating shaft 122 may be provided with screw teeth 1220 for fastening connection with the first fastener 126, also for fixing the rotating shaft 122 on a middle frame of the electronic device, thereby fixing the rotating shaft. The first fastener 126 may be made of a metal material, such as a dual screw, which passes through the gasket 127 and is locked on the rotating shaft 122 to lock the rotating shaft 122 with the rotating shaft support. The first bearing 124 may be made of stainless steel or ceramic, and is assembled on the sub-rotating wheel 123, one first bearing 124 is assembled at each of two ends of each rotating wheel 123, and a bearing gasket 125 is also assembled. The bearing gasket 125 may be made of metal. When the sub-rotating wheels are assembled on the rotating shaft, bearing gaskets are arranged on the two sides of each rotating wheel, the rotating shaft penetrates through inner holes of the bearing gaskets, after the two ends of the rotating shaft are locked through the dual screws, the gaskets serve to fix the bearing cones, and prevent the bearing cones from rotating along with the bearing cups, and serve to ground the first bearings and the supports.

Figure 21:
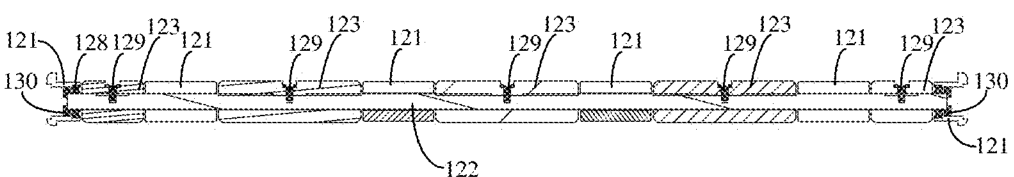
FIG. 21 is a schematic structural diagram of a rotating shaft component of a stretchable screen structure according to another exemplary embodiment of the present disclosure.

Referring to FIG. 9 and FIG. 21, in some implementations, the rotating shaft 122 is rotatably connected to the shaft hole, and the rotating wheel is fixedly connected to the rotating shaft 122. It can be understood that the rotating shaft 122 is fixedly connected to the rotating wheel, the rotating wheel does not rotate relative to the rotating shaft 122, the rotating shaft 122 is rotatable relative to the rotating shaft support, and when the flexible display screen 90 is stretched or retracted, the rotating wheel and the rotating shaft 122 are driven to rotate together.

In some implementations, the rotating shaft support includes a plurality of sub-supports 121, the plurality of sub-supports 121 are disposed on the bracket 11 at intervals in a direction perpendicular to the first direction X, the plurality of sub-supports 121 are provided with sub-shaft holes, the sub-shaft holes of the plurality of sub-supports 121 are coaxially disposed to form the shaft hole, and the rotating shaft 122 penetrates through the plurality of sub-shaft holes to be fixedly connected to the plurality of sub-supports 121. The rotating wheel includes a plurality of sub-wheels 123, and one sub-wheel 123 is disposed between every two adjacent sub-supports 121. It can be understood that the rotating shaft support is arranged as a plurality of sub-supports 121, the rotating wheel is arranged as a plurality of sub-rotating wheels 123, and the sub-supports 121 and the sub-rotating wheels 123 are alternately arranged, so that a strength of the rotating shaft support can be enhanced while rotating performance of the rotating wheel is ensured, and an overall structural strength is improved. It may be understood that each sub-support 121 of the rotating shaft support is fixedly connected to the bracket 11, or may be integrally formed with the bracket 11. It should be noted that sizes of the sub-supports 121 may be different, for example, the sub-supports 121 may be divided into small supports and large supports, the sub-supports located on two sides are small supports, and the sub-supports located in the middle are large supports. Sizes of the sub-rotating wheels 123 may also be different, for example, the sub-rotating wheels 123 are divided into large rotating wheels and small rotating wheels, which may be set according to actual needs, which is not limited in the present disclosure.

In some implementations, the rotating shaft component 12 further includes two second bearings 128 respectively sleeved on two ends of the rotating shaft 122, and the ends of the rotating shaft 122 is rotatably connected to the rotating shaft support through the second bearings 128. The second bearing 128 includes a bearing cone and a bearing cup rotatably connected to the bearing cone, the bearing cone is connected to the rotating shaft support, and the bearing cup is connected to the rotating shaft 122. It can be understood that the rotating shaft 122 rotates relative to the sub-support 121 of the rotating shaft support through the second bearing 128, and the second bearing 128 can reduce friction loss caused by rotation of the rotating shaft 122. The sub-rotating wheel 123 and the rotating shaft 122 may be designed to be zero-engaged in a radial direction, to ensure that the sub-rotating wheel 123 rotates with the rotating shaft 122. The sub-support 121 of the rotating shaft support and the rotating shaft 122 may be of an avoidance design in a radial direction, to ensure that there is a gap between the sub-rotating wheel 123 and the rotating shaft 122 to implement rotation. In this embodiment, only two second bearings 128 are required to be provided to implement rotation of the rotating shaft 122 relative to the rotating shaft support, which reduces the number of bearings and simplifies the model design.

In some implementations, the rotating shaft component 12 further includes two shaft covers 130, one of the shaft covers 130 abuts against an inner ring of the adjacent rotating shaft 122 from one end of the shaft hole, and the other of the shaft covers 130 abuts against the inner ring of the adjacent rotating shaft 122 from the other end of the shaft hole. By compressing the bearing cones by using the shaft covers 130, limiting effect of the rotating shaft 122 in an axial direction can be achieved, so as to present the rotating shaft 122 from moving along the axial direction.

In some implementations, the rotating shaft component 12 further includes a plurality of second fasteners 129, and the second fasteners 129 are fixedly connected to the rotating shaft 122 through the sub-rotating wheel 123. It can be understood that one sub-rotating wheel 123 may be fixedly connected to the rotating shaft 122 through one second fastener 129, or may be fixedly connected to the rotating shaft 122 through a plurality of second fasteners 129, which is not limited in the present disclosure.

Referring to FIG. 25 to FIG. 28, an embodiment of the present disclosure provides an electronic device, which may be a mobile phone, a mobile terminal, a tablet computer, a notebook computer, a terminal handheld device with a screen, a vehicle-mounted display device, and the like. The electronic device includes a housing, a stretchable screen structure described in the above embodiment, and a driving mechanism 99.

The housing includes a first housing 91 and a second housing 92 slidably disposed on the first housing 91 along the first direction X, and the first housing 91 and the second housing 92 encircle to define an accommodating structure 991 including an opening. The stretchable screen structure is disposed in the accommodating structure 991, the rotating shaft component 12 is located on a side close to the second housing 92, a first end 901 of the flexible display screen 90 is located on a side close to a bottom of the housing, and a second end 902 of the flexible display screen 90 is connected to the first housing 91 to cover the opening. The driving mechanism 99 is disposed in the accommodating structure 991, and the driving mechanism 99 is connected to the sliding rail mechanism and configured to drive the sliding rail mechanism to move along the first direction X. Optionally, the first housing 91 may be provided with a supporting plate 93, a second end of the flexible display screen 90 is connected to the supporting plate 93, and the supporting plate 93 may support and protect the flexible display screen 90.

The driving mechanism 99 includes a frame body 30, and a driving component and a transmission component mounted on the frame body 30. The frame body 30 may be provided with a mounting member 302 for connecting with the middle frame of the electronic device, and the mounting member 302 is fixed on the middle frame by a fastener, thereby mounting the driving mechanism 99 on the middle frame. Optionally, the number of driving mechanisms 99 may be set according to actual needs, and in an example shown in FIG. 28, the number of the driving mechanisms 99 is two, and the two driving mechanisms 99 are symmetrically arranged on the first housing 91, so that the sliding rail mechanism can be more stably driven to move, two sides of the sliding rail mechanism are uniformly stressed, and the movement is more stable.

The driving component includes a driving member 31 and a reduction gearbox structure 32 connected to the driving member 31, and the driving member 31 and the reduction gearbox structure 32 are both mounted on the frame body 30. Optionally, the driving member 31 may be a driving motor or a driving electric device.

The transmission component includes a first transmission member 14 and a second transmission member 15 movably connected to the first transmission member 14, the first transmission member 14 is mounted on the frame body 30 and connected to the reduction gearbox structure 32, and the second transmission member 15 is used to be drivingly connected to the flexible display screen of the stretchable screen structure.

The driving member 31 outputs a first torque to the reduction gearbox structure 32, the reduction gearbox structure 32 converts the first torque into a second torque and outputs the second torque to the first transmission member 14 to drive the first transmission member 14 to rotate, and the second transmission member 15 moves relative to the first transmission member 14 to drive the flexible display screen to move. The first torque is less than the second torque. It can be understood that the driving mechanism drives the sliding rail mechanism to move along the first direction X, and drives the second housing 92, the sliding rail component 20, the first end of the flexible display screen 90, and the sliding member 22 to move relative to the first housing 91 along the first direction X, so that the flexible display screen 90 is switched between the retracted state and the stretched state.

Through the above arrangement, the driving mechanism 99 converts the first torque output by the driving member into a second torque with a larger torque through the reduction gearbox structure, and then transmits the second torque to the first transmission member to rotate the first transmission member, thereby driving the flexible display screen to move, which can convert a low torque of the driving member into a high torque to drive the first transmission member to rotate, thereby better driving the flexible display screen to move.

Figure 2:
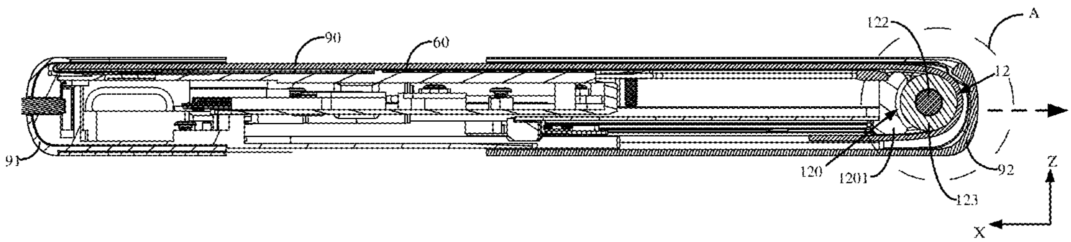
FIG. 2 is a schematic structural diagram of an electronic device in a stretched state according to an exemplary embodiment of the present disclosure.
Figure 3:
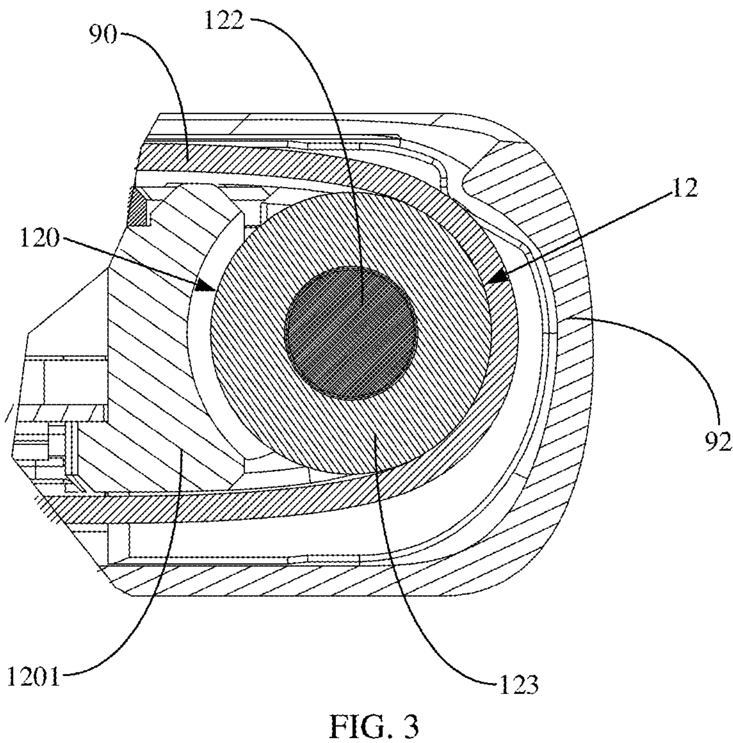
FIG. 3 is a partially enlarged schematic diagram of part A in FIG. 2.
Figures 4, 5:
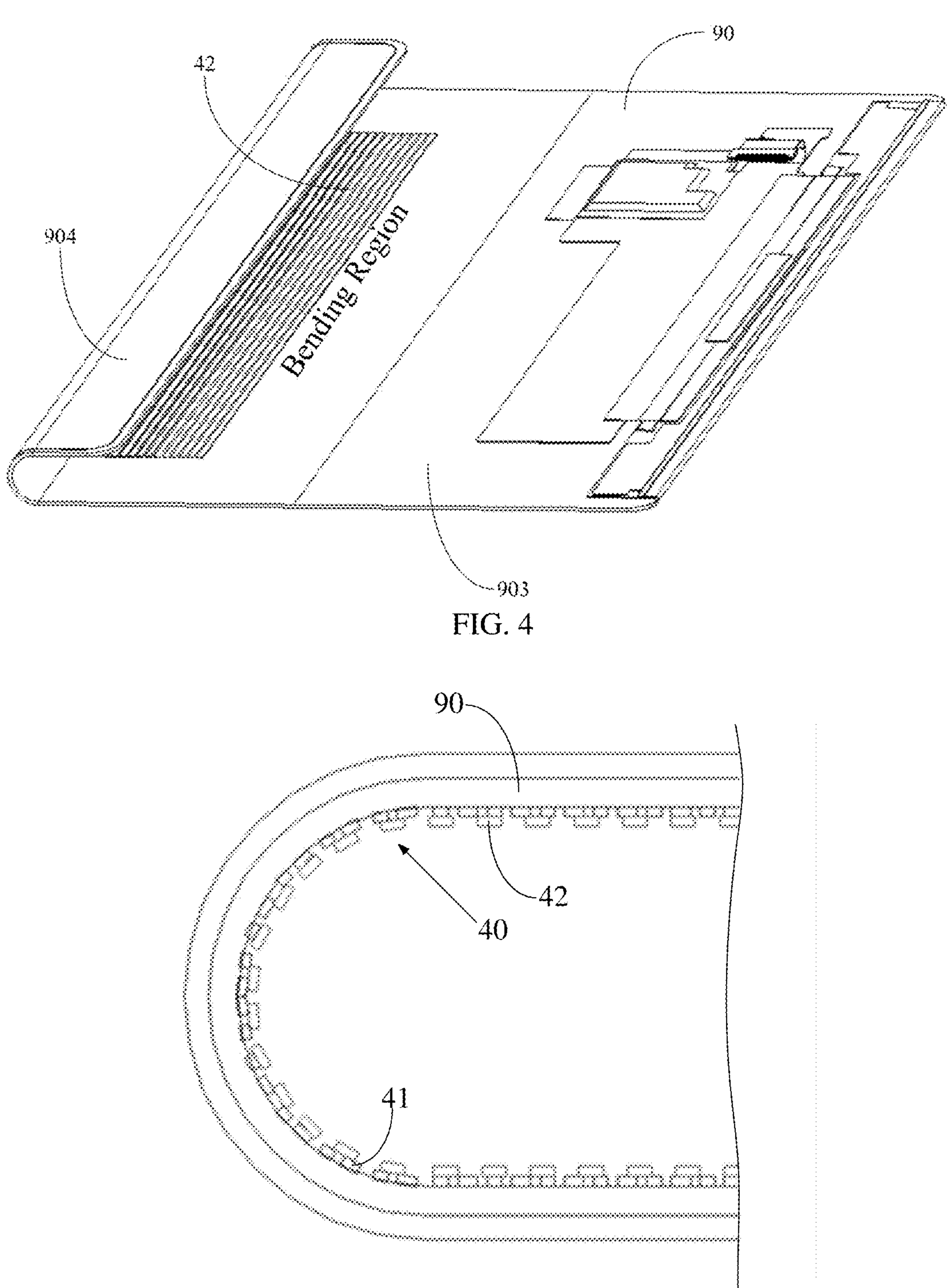
FIG. 4 is a schematic structural diagram of a stretchable screen structure according to an exemplary embodiment of the present disclosure.
FIG. 5 is a partially enlarged schematic diagram of a stretchable screen structure according to an exemplary embodiment of the present disclosure.

Referring to FIG. 1 to FIG. 3, in some implementations, the rotating shaft component 12 is disposed at an end of the second housing 92 away from the first housing 91. The rotating shaft component 12 includes a track portion 120. A thickness of the track portion 120 along a third direction Z perpendicular to the first direction X gradually decreases from an end close to the first housing 91 to an end away from the first housing 91 along the first direction X. The flexible display screen 90 is disposed around the track portion 120, where a first end of the flexible display screen 90 is connected to the sliding rail mechanism, and a second end of the flexible display screen 90 is connected to the first housing 91 and covers the opening. It can be understood that the bending portion 904 of the flexible display screen 90 is disposed around the track portion 120.

It can be understood that the thickness of the track portion 120 along the third direction Z is set to gradually decrease along the first direction X from an end close to the first housing 91 to an end away from the first housing 91, that is, the thickness of the track portion 120 along the third direction Z is gradually decreased from left to right in the example of FIG. 1 and FIG. 2 to form a cone-like structure. In this way, when the flexible display screen 90 moves, even if there are forces in different directions when the screen is bent, under the magnetic attraction cooperation effect of the first magnetic component 40 and the second magnetic component 50, the flexible display screen 90 can be always attached to the track portion 120 at a position close to the rotating shaft component 12, so that the flexible display screen 90 can be better attached to the support component 60, a relatively flat display surface can be achieved, and the problem of screen camber is solved.

In some implementations, the track portion 120 includes a track surface, the flexible display screen 90 is disposed around the track surface, an end surface of the track surface away from the first housing 91 is an arcuate surface, and the flexible display screen 90 may be bent along the track surface, so that a moving track at an end of the flexible display screen 90 is an elliptical moving track, which may counteract an camber problem caused by forces in different directions on the screen. Optionally, in this embodiment, the track surface is elliptical. Certainly, in other examples, the track surface may also have other shapes, for example, the track surface may include a first track surface and second track surfaces connected to two ends of the first track surface, and the first track surface may have an arcuate surface, which may be understood as an end surface away from the first housing 91. The second track surface may be flat, one end of the second track surface is connected to the first track surface, and the other end of the second track surface extends toward the outside of the housing and forms an angle with the first direction, so that the thickness of the track portion 120 in the third direction Z gradually decreases from the end close to the first housing 91 to the end away from the first housing 91 in the first direction X.

In some embodiments, the track portion 120 includes a track body 1201 and a rotating wheel 123, the track body 1201 is provided with an accommodating cavity, and the rotating wheel 123 is movably disposed in the accommodating cavity. The flexible display screen 90 is disposed around the track body 1201 and a part of the rotating wheel 123, and an outer contour surface of the track body 1201 and a part of an outer contour surface of the rotating wheel 123 form the track surface. In this way, the track body 1201 and the outer contour surface of the rotating wheel 123 cooperate to form an elliptical track surface of the track portion 120, which can solve the problem of camber at the bending position when the screen moves.

In some implementations, the driving component may further include a control circuit board 312 connected to the driving member 31 and configured to control the driving member 31 according to an instruction. The control circuit board 312 may be a flexible FPC (flexible printed circuit) circuit board. The control circuit board 312 and a terminal mainboard of the electronic device are electrically connected, when the flexible display screen needs to be stretched, the terminal mainboard transmits a stretching command to the control circuit board 312, the control circuit board 312 controls the driving motor to rotate, the driving motor amplifies the torque of the driving motor through the reduction gearbox structure 32, drives the second transmission element 15 to move linearly relative to the first transmission element 14, and drives the flexible display screen to stretch outwards by the second transmission element 15, thus completing stretching of the flexible display screen. When the flexible display screen needs to be retracted, a retracting command may be sent to the terminal mainboard by clicking a display screen of the electronic device, the terminal mainboard transmits the retracting command to the control circuit board 312, the control circuit board 312 controls the driving motor to rotate (in a direction opposite to the direction of stretching rotation), the driving motor amplifies the torque of the driving motor through the reduction gearbox structure 32, drives the second transmission member 15 to move linearly relative to the first transmission member 14, and drives the flexible display screen to retract to the initial position by the second transmission member 15. In this embodiment, the control circuit board 312 is connected to the driving motor through welding, and the control circuit board 312 is electrically connected to the terminal mainboard, or is connected to the terminal mainboard through a BTB (board to board) connector, so that the driving motor is powered on, and the driving motor is controlled to rotate through the control signal.

In some implementations, the driving motor may be a DC (direct current) stepper motor, and the stepper motor is an open-loop control motor that converts an electrical pulse signal into an angular displacement or a linear displacement. Under a condition of non-overload, a rotating speed and a stopping position of the motor only depend on a frequency and a pulse number of the pulse signal and are not influenced by load change, when a stepper driver receives a pulse signal, the stepper driver drives the stepper motor to rotate by a fixed angle in a set direction, and the rotation of the stepper motor is operated in steps each at a fixed angle. The angular displacement can be controlled by controlling the number of pulses, thereby achieving the purpose of accurate positioning. Meanwhile, the rotating speed and acceleration of the motor can be controlled by controlling the pulse frequency, so that the purpose of speed regulation is achieved, so as to input the rotating torque.

The first transmission member 14 is a lead screw, the second transmission member 15 is a nut in threaded fit with the lead screw, and two ends of the lead screw are connected to the frame body 30 through bearings 141. The bracket 11 of the stretchable screen structure is provided with a transmission member 13. The lead screw extends along the first direction X, and the nut abuts against the transmission member 13. The driving motor drives the lead screw to rotate, and further to drive the nut and the transmission member to move along the first direction X, thereby driving the sliding rail mechanism to move along the first direction X. It should be noted that the first transmission member and the second transmission member may also adopt structures such as a gear rack and a worm gear, which is not limited in the present disclosure.

In some implementations, the driving mechanism 99 further includes a guiding rod 33 disposed on the frame body 30, and the guiding rod 33 is disposed parallel to the lead screw. The nut includes a first sleeve portion 151 and a second sleeve portion 152, the first sleeve portion 151 is in threaded connection with the lead screw, and the second sleeve portion 152 is sleeved on the guiding rod 33. The second transmission member 15 is further provided with a protrusion 153 for abutting against the transmission member 13 of the bracket 11 of the stretchable screen structure. It can be understood that the nut is in threaded connection with the lead screw through the first sleeve portion 151, and when the lead screw rotates, the nut moves linearly relative to the lead screw. During movement, the second sleeve portion 152 moves along the guiding rod 33 to guide the nut.

In some implementations, the driving member 31 includes an output shaft 311, and the reduction gearbox structure 32 includes a first reduction gearbox and a second reduction gearbox. The first reduction gearbox includes a first gear 321, the second reduction gearbox includes a second gear 322 and a third gear 323 (which may be understood as lead screw teeth) engaged with the second gear 322, the third gear 323 is connected to the first transmission member 14, the second gear 322 is engaged with the first gear 321, and the first gear 321 is connected to the output shaft 311. The output shaft 311 outputs a first torque to the first gear 321, and the first torque is converted into a second torque through the second gear 322 and the third gear 323 and output to the first transmission member 14. Through tooth fit of the first gear 321, the second gear 322 and the third gear 323, the low torque output by the driving motor can be converted into a high torque.

In some implementations, the reduction gearbox structure 32 further includes a reduction gearbox end cover 34 fixedly connected to one side of the frame body 30. Optionally, a side of the frame body 30 is provided with a side frame 301 fixedly connected to the reduction gearbox end cover 34, and the reduction gearbox end cover 34 is fixed to the side frame 301. The reduction gearbox end cover 34 is fixed to the side frame 301 by a plurality of fasteners 342 (e.g., screws). The first gear 321 and the second gear 322 are both connected to the reduction gearbox end cover 34, the third gear 323 is connected to the reduction gearbox end cover 34 through the first transmission member 14, and the reduction gearbox end cover 34 serves to fix the first gear 321, the second gear 322, the third gear 323 and the first transmission member 14.

In some implementations, the first reduction gearbox includes a first bushing 324 fixed to the reduction gearbox end cover 34, and the first gear 321 is mounted to the first bushing 324. Optionally, the reduction gearbox end cover 34 is provided with a first through hole 341, the first bushing 324 is fixed to the first through hole 341, and the first gear 321 includes sun teeth and is mounted to the first bushing 324. The second reduction gearbox includes a limiting column 35 fixed to the reduction gearbox end cover 34, the second gear 322 is mounted to the limiting column 35, and the limiting column 35 limits and fixes the second gear 322.

In some implementations, the first transmission member 14 is a lead screw, an end of the lead screw is connected to the reduction gearbox end cover 34 through a bearing 141, and the third gear 323 is engaged with the lead screw. Optionally, the reduction gearbox end cover 34 is further provided with a second through hole 343, a bearing 141 is mounted in the second through hole 343, and one end of the lead screw is mounted on the bearing 141, so as to be fixed on the frame body 30.

In some implementations, the first reduction gearbox further includes a fixed gear ring 36, driving teeth 37, a planet carrier 38, and planet gears 39.

The fixed gear ring 36 is connected to the driving member 31, and the output shaft 311 extends into the fixed gear ring 36.

The driving teeth 37 are mounted in the fixed gear ring 36 and fixed to the output shaft 311. Optionally, the first reduction gearbox further includes a second bushing 371, and the driving teeth 37 are mounted on the second bushing 371, so as to protect and limit the driving teeth 37.

The planet carrier 38 is mounted in the fixed ring gear 36 and is fitted and fixed with the first gear 321. Optionally, the first reduction gearbox further includes a third bushing 381, and the planet carrier 38 is mounted on the third bushing 381, so as to protect and limit the planet carrier 38.

The planet gears 39 are mounted on the planet carrier 38 and cooperate with the driving teeth 37.

The output shaft 311 outputs a first torque to the driving teeth 37, and the first torque is transmitted to the first gear 321 after being decelerated by the driving teeth 37, the planet gears 39, and the planet carrier 38, to achieve a first-stage deceleration effect. The torque is then decelerated by the first gear 321 and then transmitted to the second gear 322 to achieve a second-stage deceleration effect. Then, after being decelerated by the second gear 322, the torque is converted into a second torque to be transmitted to the third gear 323, to achieve a third-stage deceleration effect. The third gear 323 then transmits the second torque to the first transmission member 14 to drive the first transmission member 14 to rotate.

Through the above arrangement, the driving teeth 37, the driving teeth 37 and the planet gears 39 cooperate with each other to form a first-stage reduction gearbox. The first gear 321, the second gear 322, and the third gear 323 cooperate with each other to form a second-stage and a third-stage reduction gearboxes. The planet gears 39 may serve as first-stage reduction teeth, the first gear 321 may serve as second-stage reduction teeth, the second gear 322 may serve as third-stage reduction teeth, and the third gear 323 may serve as a lead screw gear.

It can be understood that the first reduction gearbox is a core component of the driving mechanism, one end of the first reduction gearbox and the driving motor are assembled and welded together, and the other end of the first reduction gearbox and the frame body 30 are welded and fixed together. The first reduction gearbox includes an output shaft 311 of a driving motor, driving teeth 37, a second bushing 371, planet gears 39, a planet carrier 38, a third bushing 381, a fixed gear ring 36, and a first gear 321. All parts are fixed through gear matching, and the output shaft 311, the driving teeth 37, the second bushing 371, the planet gears 39, the planet carrier 38, the third bushing 381 and the first gear 321 are fixedly engaged in the fixed gear ring, the driving teeth 37 and the output shaft 311 of the driving motor are fixed, the planet carrier 38 and the first gear 321 are fixed by engaging, the other end of the first gear 321 is fixed to the first bushing 324, and is further fixed to the reduction gearbox end cover 34 through the first bushing 324. The second gear 322 is fixed on the frame body 30 and the reduction gearbox end cover 34 through the limiting column 35. The third gear 323 is fixed on the first transmission member 14, one end of the first transmission member 14 is fixed on the frame body 30 through the bearing 141, and the other end is also fixed on the reduction gearbox end cover 34 through the bearing 141. The reduction gearbox end cover 34 is fixed on the frame body 30 through fasteners 342, and the three gears of the first gear 321, the second gear 322 and the third gear 323 are engaged with each other through teeth to form a second-stage and a third-stage reduction gearboxes. The torque output by the driving motor is decelerated through the first reduction gearbox and the second reduction gearbox, and a torque more than multiple times or tens of times of the output torque is output to the lead screw to drive the lead screw to rotate. The lead screw drives the nut to move. The main function of the reduction gearbox structure is to convert low torque output by the driving motor into high torque.

In some embodiments, the frame body 30 may be manufactured by using MIM (Metal injection Molding), and a lathe or a CNC (Computer Numerical Control) machining center needs to be used for machining an aperture and certain sizes. The main function of the frame body 30 is to fix components such as a reduction gearbox structure, a lead screw, a nut, a bearing, and a guiding rod. Therefore, accuracy requirement of the frame body 30 is high, flatness requirement is also high, and the accuracy of the frame body 30 directly affects stability of the entire driving mechanism. The entire frame body 30 may be fixed on the first housing 91 of the middle frame of the electronic device.

The nut can adopt MIM (Metal injection Molding) and plastic two-shot injection molding, the plastic adopts engineering plastic (POM material is commonly used), the material has a self-lubricating effect, one side of the nut is fixed on the guiding rod, the other end of the nut is fixed on the lead screw, a lead screw guide groove needs to be designed when the nut is fixed at the lead screw end, so that the nut can be driven to move linearly. According to structural requirements of a push-out component, a rib position is designed to be connected and fixed with a side sliding member, so as to push the side sliding member to move. The guiding rod can be made of stainless steel, a requirement for surface roughness is high, and the nut serves to guide and fix. The lead screw is generally made of high strength tool steel, and is manufactured by a lathe or a machining center for multiple times. The two ends of the lead screw are fixed with bearings, one end of the lead screw is fixed on the frame body, the other end of the lead screw is fixed on the reduction gearbox end cover, the driving motor drives the lead screw to rotate through the reduction gearbox structure, and the lead screw drives the nut to linearly move. Therefore, strength and precision of the lead screw directly affect stability and smoothness of the nut pushing the sliding member.

Figure 22:
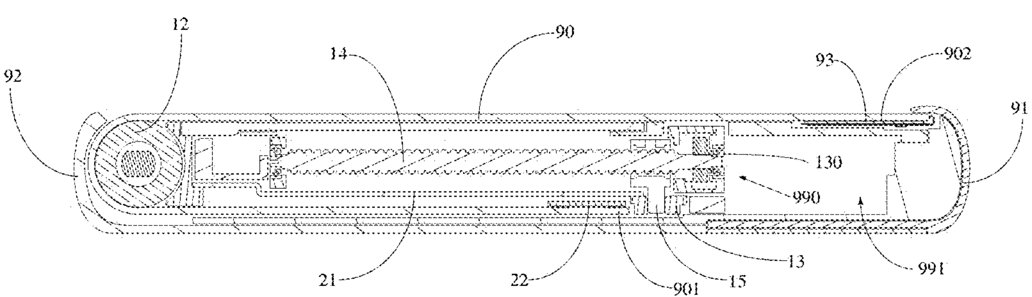
FIG. 22 and FIG. 23 are schematic diagrams of an electronic device when a flexible display screen is in a retracted state and a stretched state respectively according to an exemplary embodiment of the present disclosure.
Figure 23:
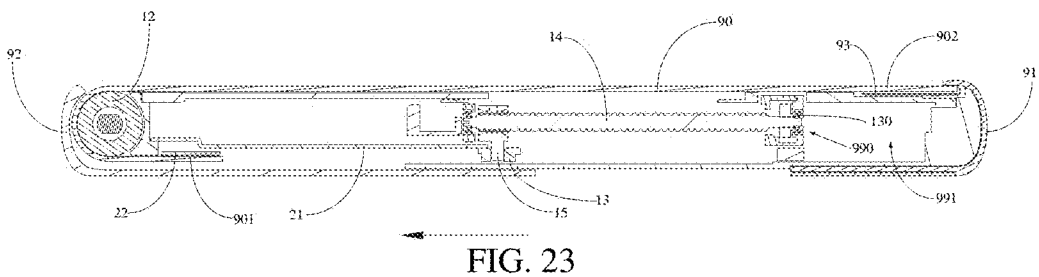
Figure 24:
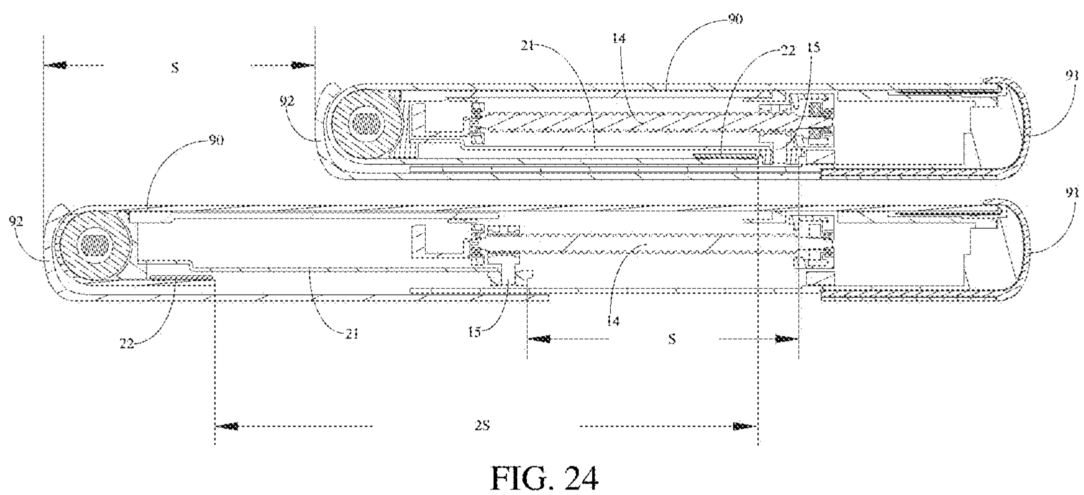
FIG. 24 is a comparison diagram of an electronic device when a flexible display screen is in a retracted state and a stretched state respectively according to an exemplary embodiment of the present disclosure.
Figure 25:
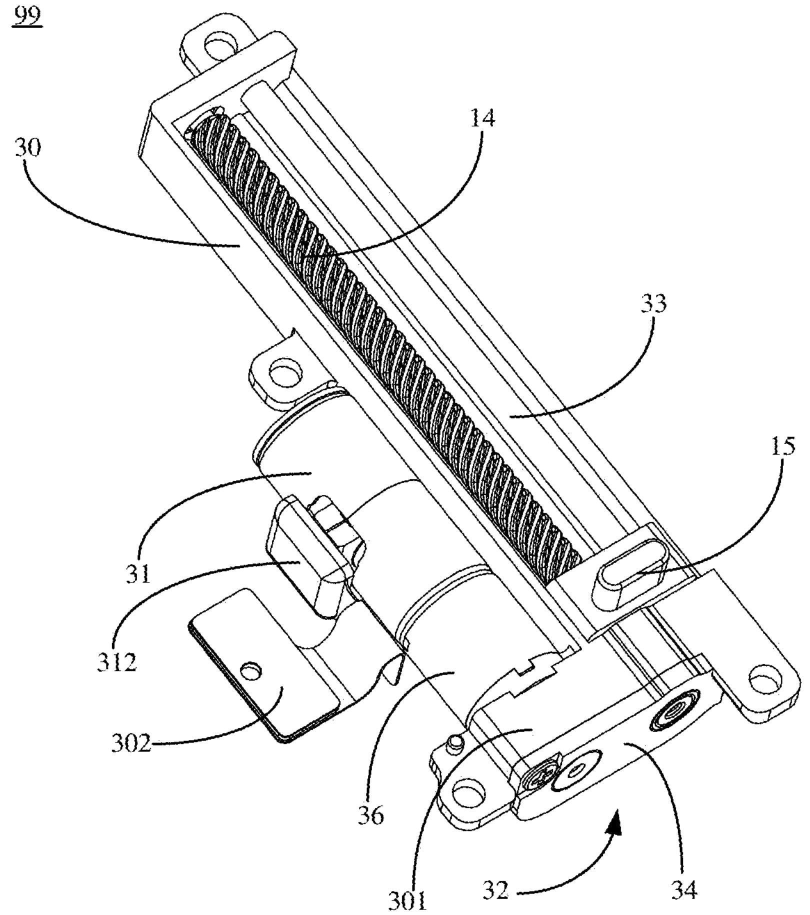
FIG. 25 is a schematic three-dimensional diagram of a driving mechanism of an electronic device according to an exemplary embodiment of the present disclosure.
Figure 26:
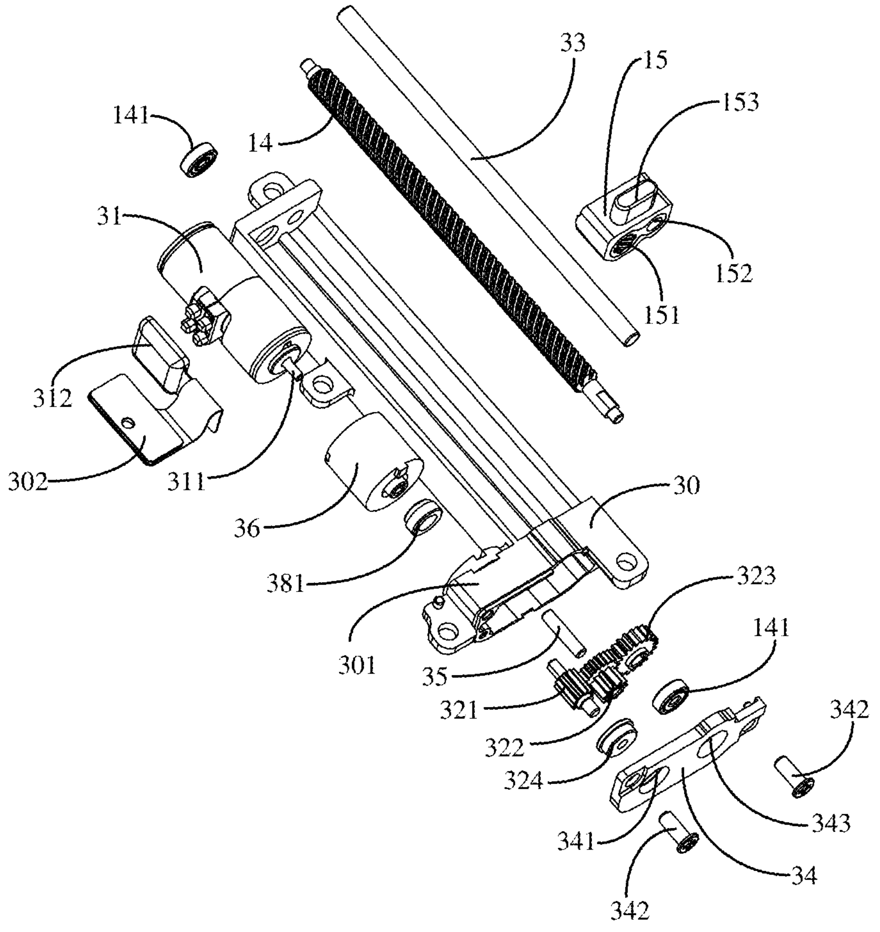
FIG. 26 is a schematic exploded diagram of a driving mechanism of an electronic device according to an exemplary embodiment of the present disclosure.
Figure 27:
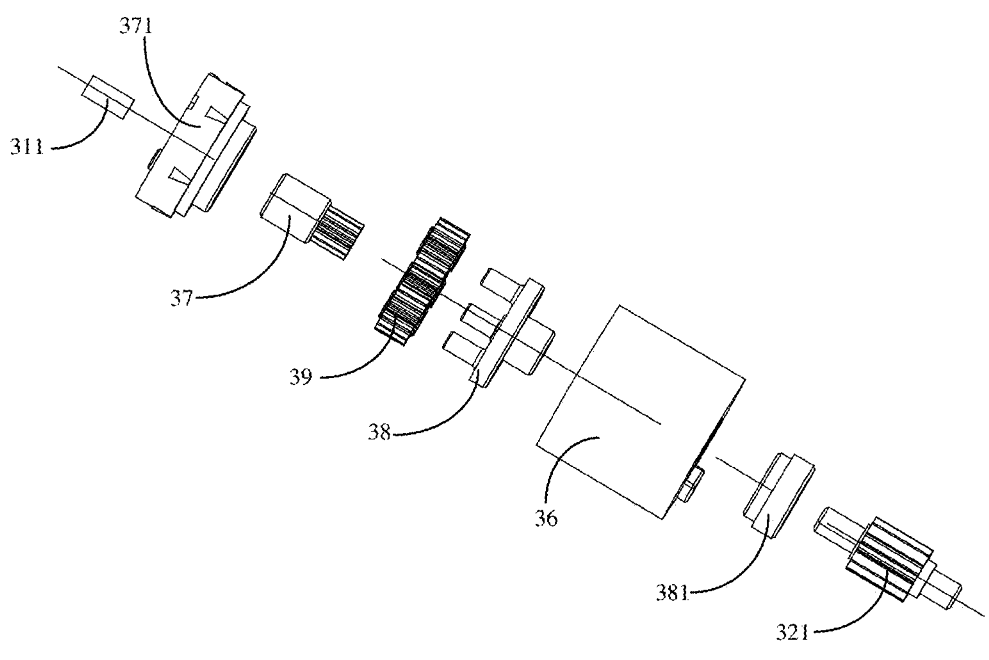
FIG. 27 is a schematic exploded diagram of a first reduction gearbox of a driving mechanism of an electronic device according to an exemplary embodiment of the present disclosure.
Figure 28:
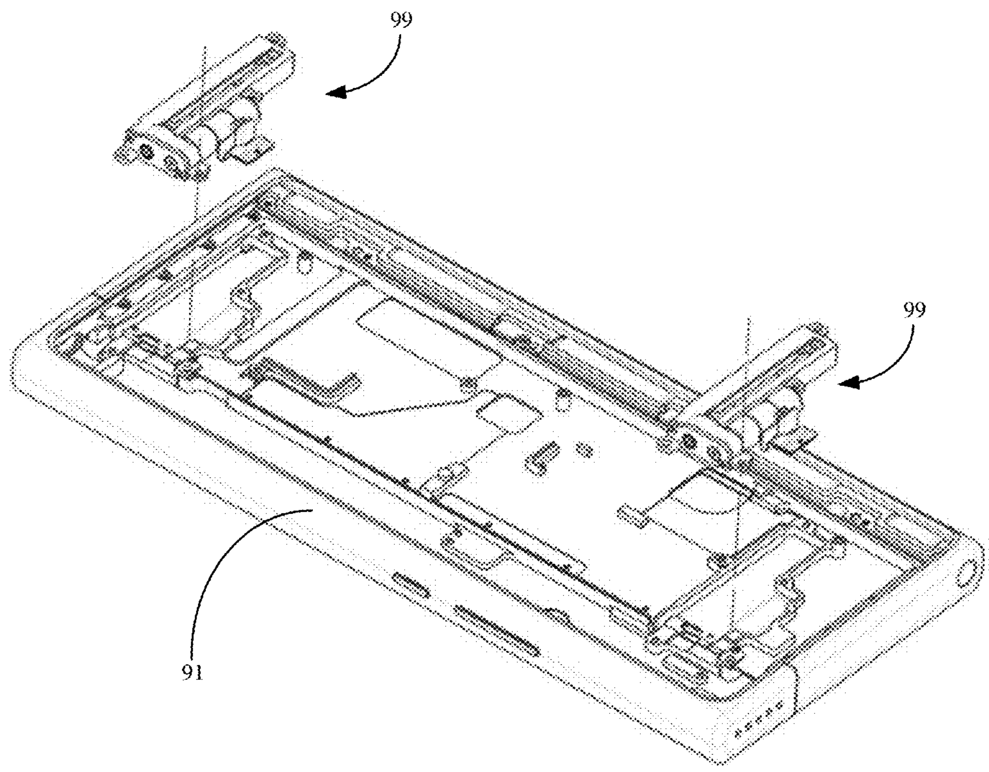
FIG. 28 is a schematic installation position diagram of a driving mechanism of an electronic device according to an exemplary embodiment of the present disclosure.
Figure 29:
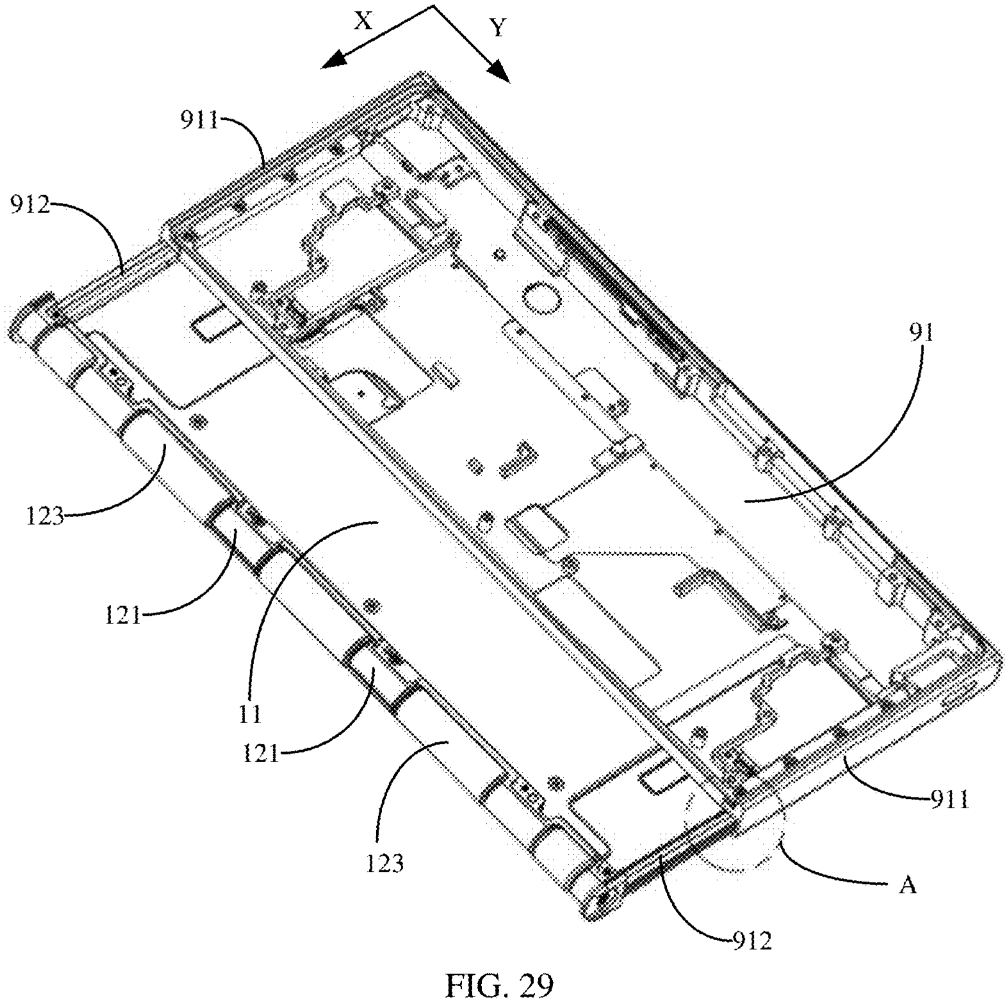
FIG. 29 is a schematic structural diagram of a sliding rail mechanism and a part of a housing of an electronic device according to an exemplary embodiment of the present disclosure.
Figure 30:
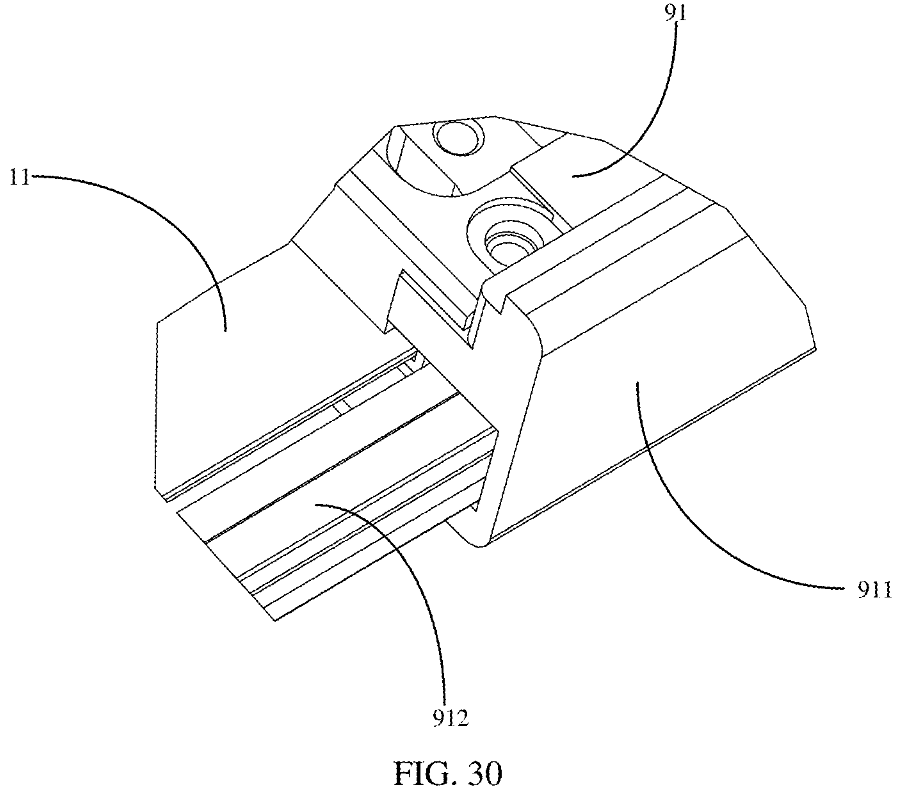
FIG. 30 is an enlarged schematic diagram of part A in FIG. 29.
Figure 31:
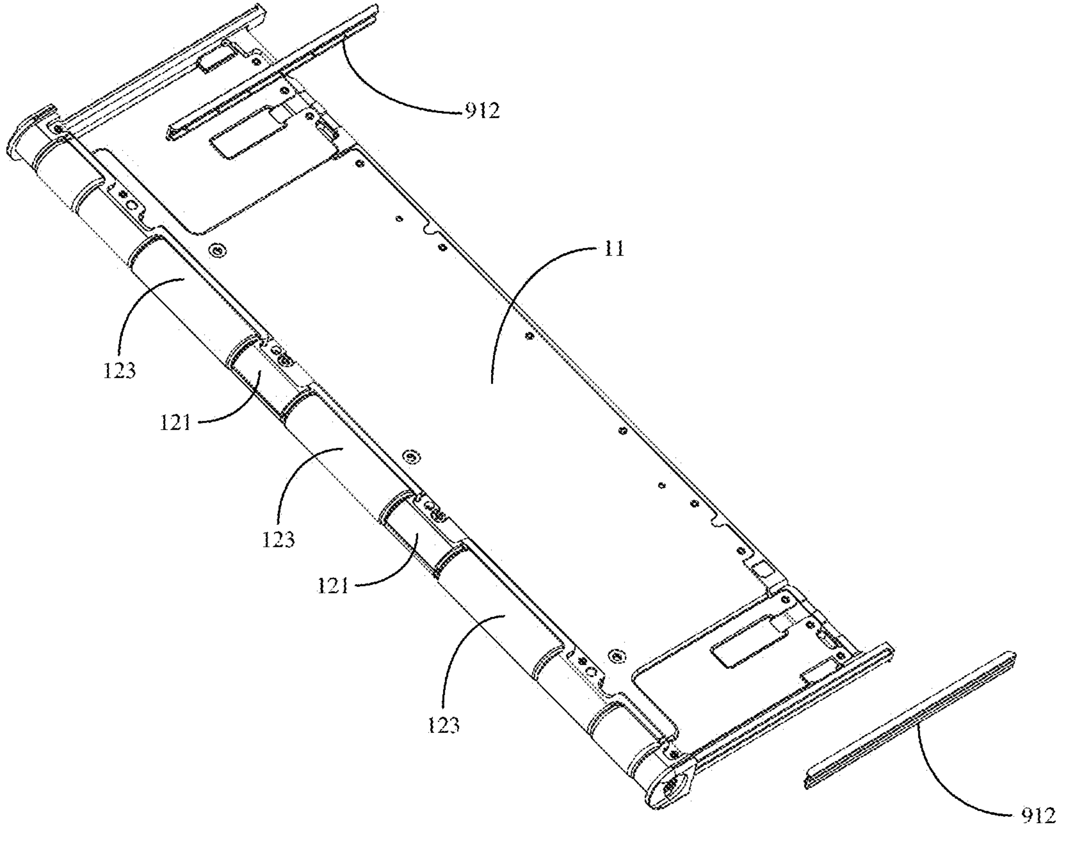
FIG. 31 is a schematic structural diagram of a bracket of a sliding rail mechanism of an electronic device according to an exemplary embodiment of the present disclosure.
Figure 32:
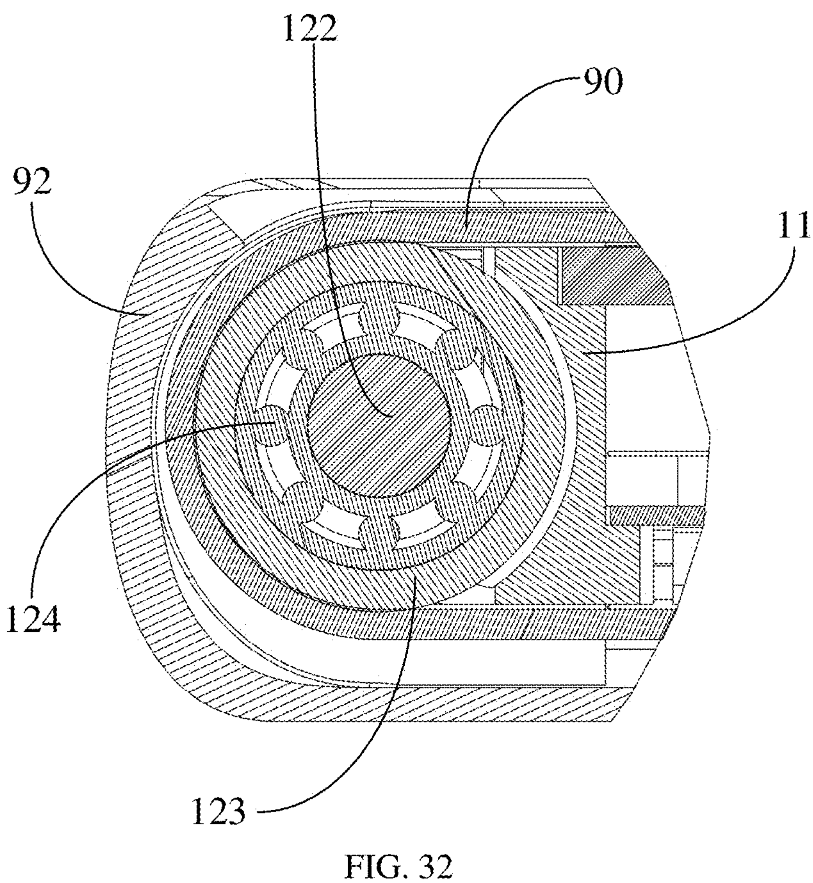
FIG. 32 is a schematic partially enlarged diagram of a rotating shaft component part in FIG. 22.
Figure 33:
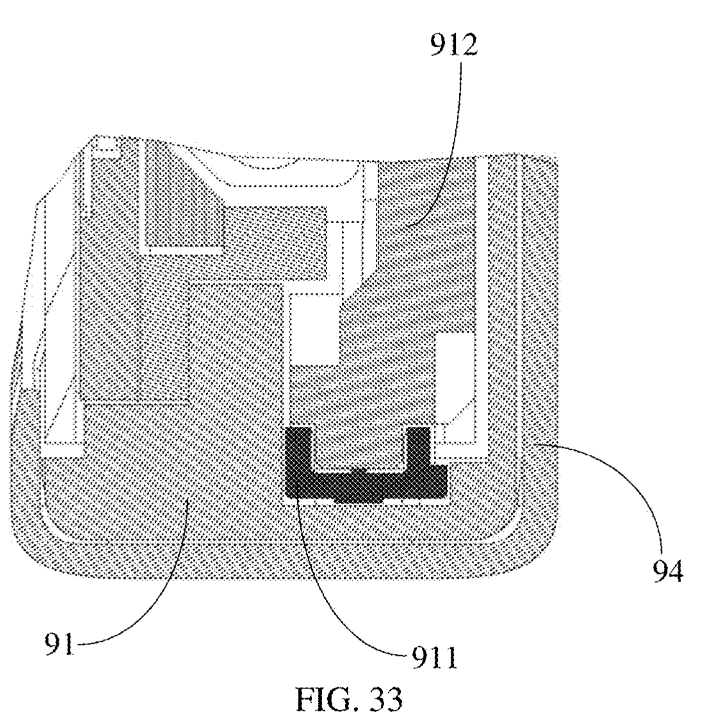
FIG. 33 is a sectional diagram of FIG. 30.

Still referring to FIG. 22 to FIG. 24, due to the pre-tension of the elastic member of the elastic component, the sliding member 22 is subjected to a pre-tension force of the elastic component at the starting position, and due to the existence of the limiting stop 25, the sliding member 22 is kept in a static state at the starting position, and the flexible display screen 90 is in a retracted state.

The driving mechanism is fixed on the middle frame (i.e., the housing) of the entire device as a power source, and after receiving an instruction through UI (User Interface), the electronic device controls the driving mechanism to drive the sliding rail mechanism to move in the first direction X (to move leftwards as shown in FIG. 23), so that the sliding rail mechanism integrally slides out relative to the first housing 91 in the direction away from the first housing 91. In this process, a first end of the flexible display screen 90 slides along with the sliding member 22, the rotating wheel of the rotating shaft component is passively rotated by a force of the flexible display screen 90, and since a second end of the flexible display screen 90 is connected with the first housing 91, as the sliding rail mechanism gradually slides out, the gradual stretching effect of the flexible display screen 90 can be achieved, as shown in FIG. 23. During a sliding process of the sliding rail mechanism, the sliding member 22 can move from one end of the fixing base 21 to the other end under pulling of the flexible display screen, and a stretching length of the flexible display screen 90 can be further increased. In addition, in the sliding process, the elastic component is stretched by the sliding member 22 to generate an elastic pulling force opposite to the sliding direction on the sliding member 22, and the flexible display screen 90 is always subjected to the pulling force in this opposite direction, which is equivalent to pulling the flexible display screen 90 rightwards, so that the stretched flexible display screen 90 is flatter, it is ensured that the bending track of the flexible display screen 90 moves according to a designed intention, and problems of visual screen bulging, camber, twisting and the like caused by stretching of the entire device are prevented.

It can be understood that, in the whole process, the sliding member 22 is pulled by the second end of the flexible display screen 90 and can move from one end of the fixing base 21 to the other end. Assuming that a sliding stroke of the sliding rail mechanism relative to the first housing 91 is S, and a sliding stroke of the sliding member 22 is S, then the first end of the flexible display screen 90 moves 2S with the sliding rail mechanism relative to the first housing 91.

When the entire device receives an external instruction to retract, the driving motor starts driving reversely to retract the sliding rail mechanism and the flexible display screen. In this process, the bracket and the fixing base move reversely under the driving of the driving mechanism, the flexible display screen and the sliding member are gradually retracted under the elastic force of the elastic component, and the sliding member returns to the starting position under the elastic force of the elastic component, thereby restoring the flexible display screen to the retracted state. Therefore, by adopting the sliding rail mechanism disclosed by the present disclosure, the flexible display screen can be stably and effectively ensured to maintain the bending form of the appearance in the stretching and retracting processes of the entire device, a power loss caused by friction force generated in the stretching and retracting processes of the screen is ensured to be at a low level, which is an operable solution easy to be implemented, thereby ensuring reliability of the product.

As shown in FIG. 29 to FIG. 33, in some implementations, the housing includes a first housing 91 and a second housing 92 slidably disposed on the first housing 91 along the first direction X, and the first housing 91 and the second housing 92 encircle to define an accommodating structure 991 including an opening. The first housing 91 is provided with a first sliding portion 911 disposed along the first direction X. A first end 901 of the flexible display screen 90 is located on a side close to a bottom of the housing, and a second end 902 of the flexible display screen 90 is connected to the first housing 91 to cover the opening. In the present embodiment, the opening is located at a top of the housing. Optionally, a decoration member 94 may be disposed outside the first housing 91 and the second housing 92 to protect and decorate.

The sliding rail mechanism includes a bracket 11 connected to the first end 901 of the flexible display screen 90, and the bracket 11 is provided with a second sliding portion 912 engaged with the first sliding portion 911. The first sliding portion 911 is one of a sliding track or a sliding groove, and the second sliding portion 912 is the other one of the sliding track or the sliding groove. The sliding rail moves along the sliding groove, so that the sliding rail mechanism drives the flexible display screen 90 to slide relative to the first housing 91 along the first direction X, to implement stretching and retracting of the flexible display screen. Optionally, the first sliding portion 911 and the first housing of the middle frame housing are integrally formed to facilitate production and processing. In the example shown in FIG. 29 to FIG. 31, the first sliding portion 911 is the sliding groove, and the second sliding portion 912 is the sliding rail. Both sides of the first housing 91 in a second direction (Y direction shown in FIG. 29) perpendicular to the first direction X (X direction shown in FIG. 29) are provided with the first sliding portions 911. Both sides of the bracket 11 along the second direction are provided with the second sliding portions 912, and by providing two sets of the first sliding portions 911 and the second sliding portions 912, the sliding rail mechanism can move more stably relative to the first housing 91, thereby improving the stability of the entire device.

Figure 34:
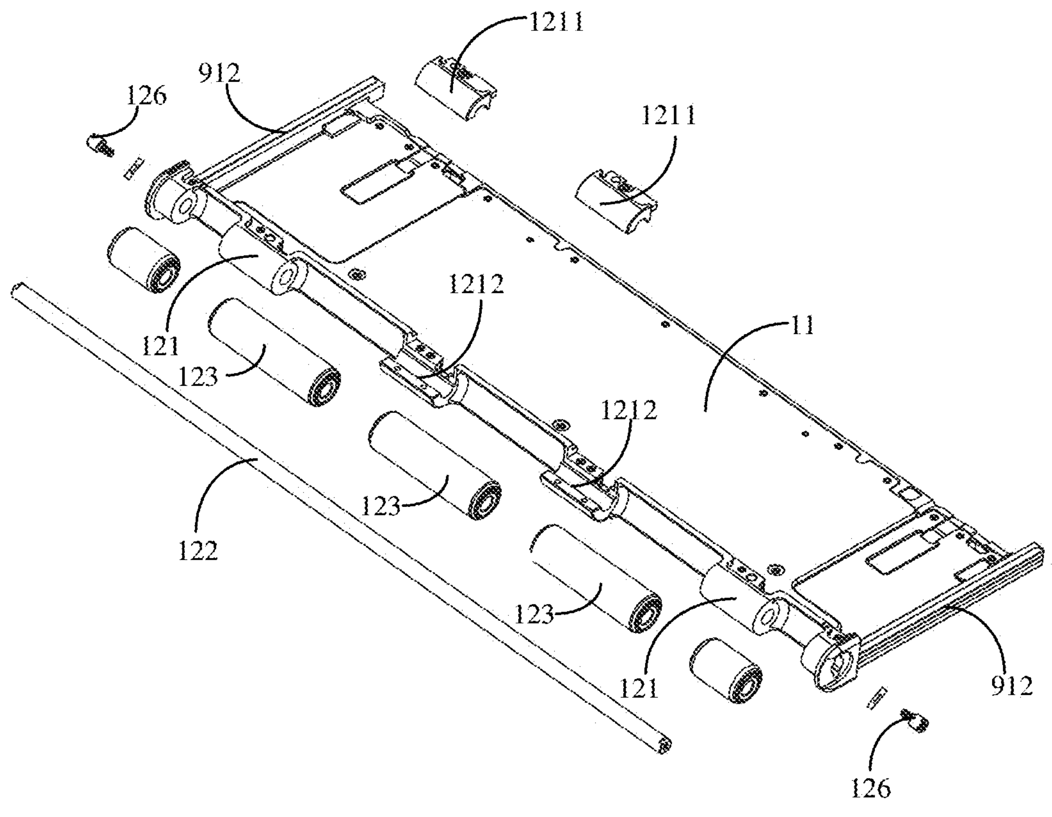
FIG. 34 is a schematic structural diagram of a sliding rail mechanism of an electronic device according to another exemplary embodiment of the present disclosure.
Figure 35:
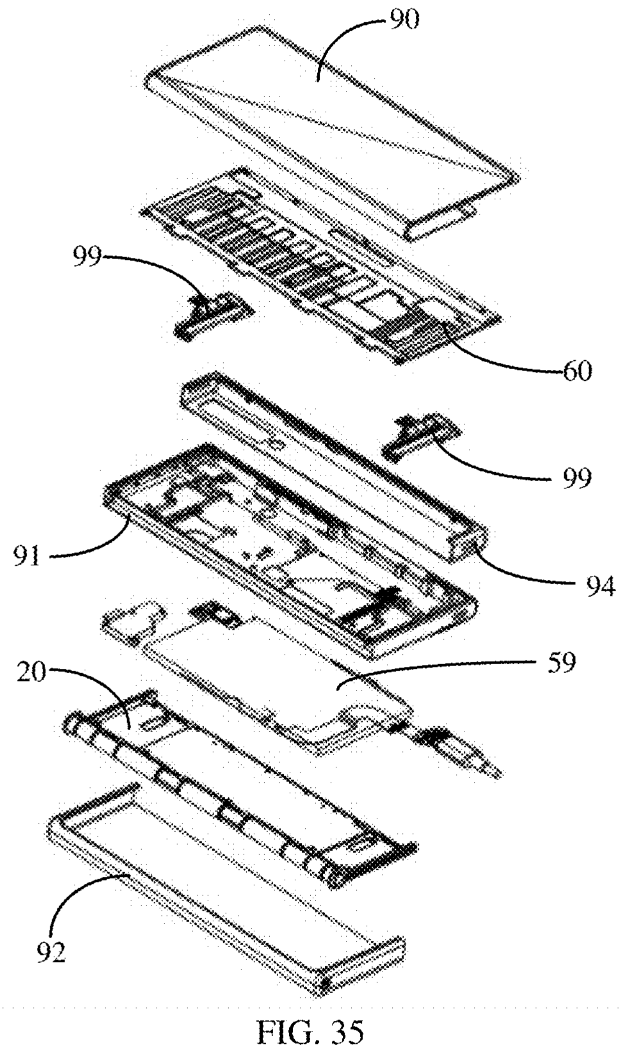
FIG. 35 is a schematic structural diagram of a sliding rail mechanism of an electronic device according to another exemplary embodiment of the present disclosure.
Figure 36:
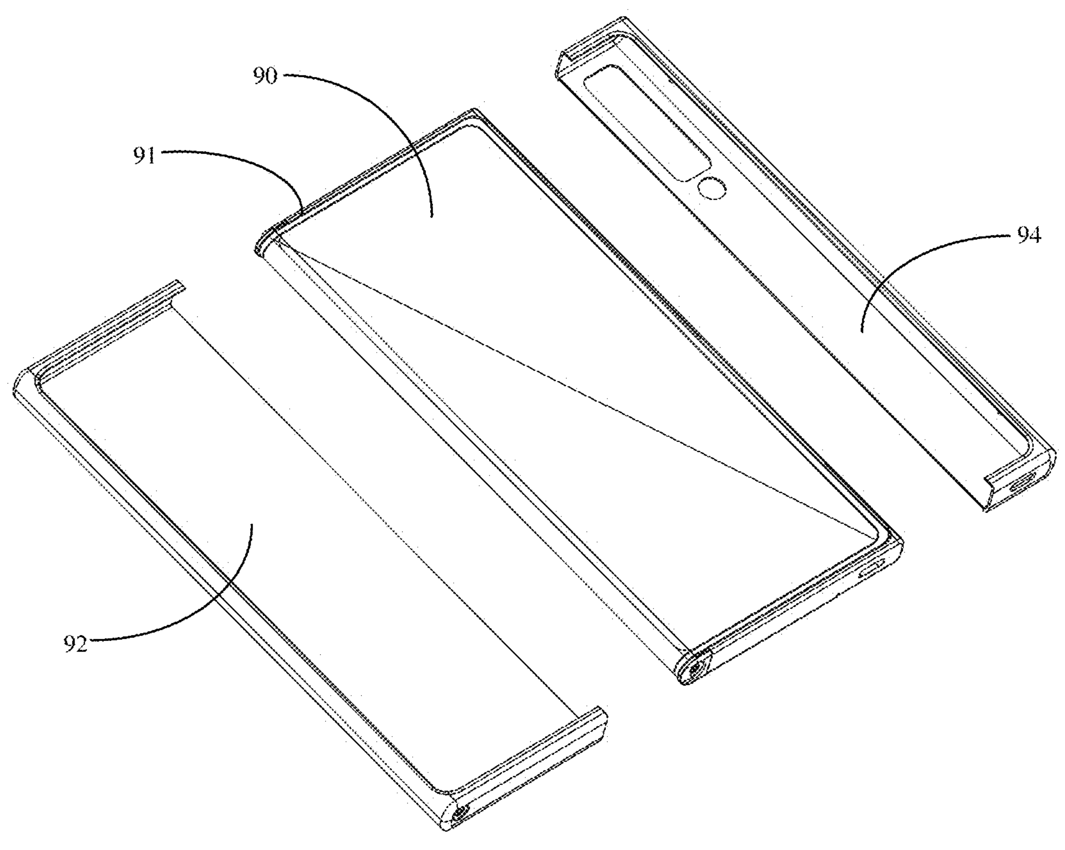
FIG. 36 is a schematic assembly diagram of a housing and a flexible display screen of an electronic device according to an exemplary embodiment of the present disclosure.
Figure 37:
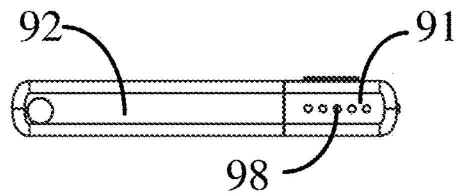
FIG. 37 is a top view of an electronic device in a retracted state according to an exemplary embodiment of the present disclosure.
Figure 38:
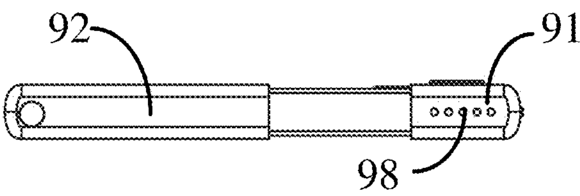
FIG. 38 is a top view of an electronic device in a stretched state according to an exemplary embodiment of the present disclosure.
Figure 39:
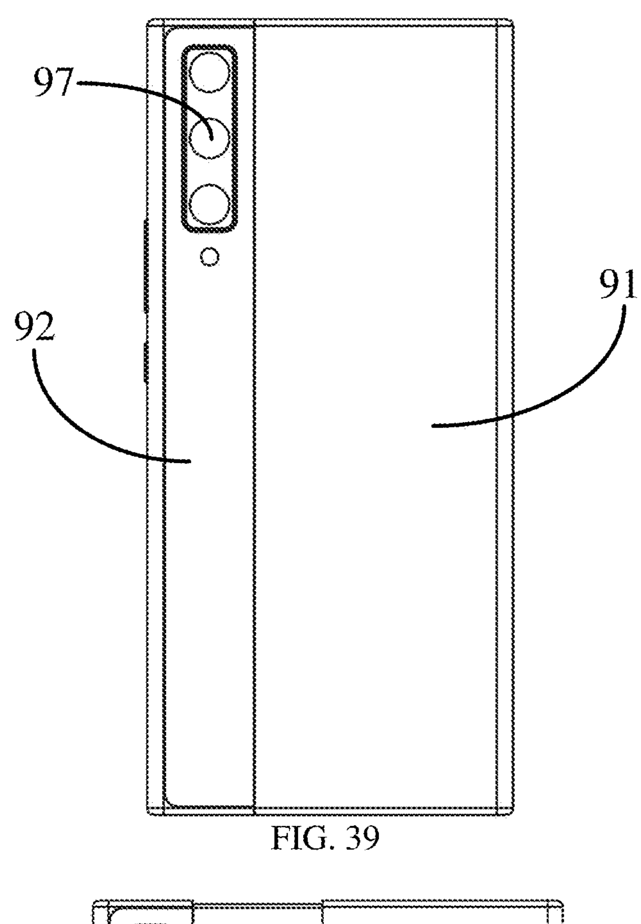
FIG. 39 is a back view of an electronic device in a retracted state according to an exemplary embodiment of the present disclosure.
Figure 40:
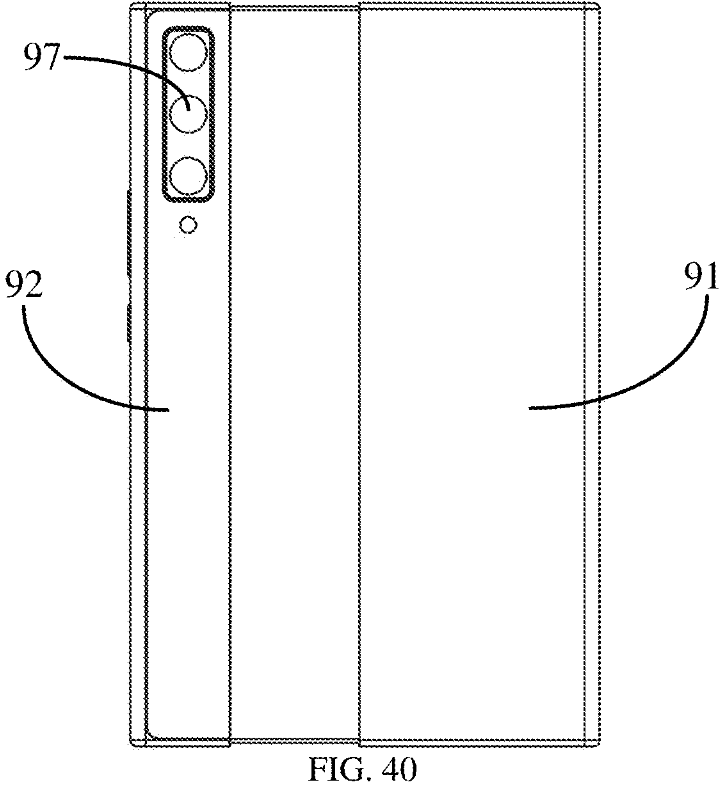
FIG. 40 is a back view of an electronic device in a stretched state according to an exemplary embodiment of the present disclosure.
Figure 41:
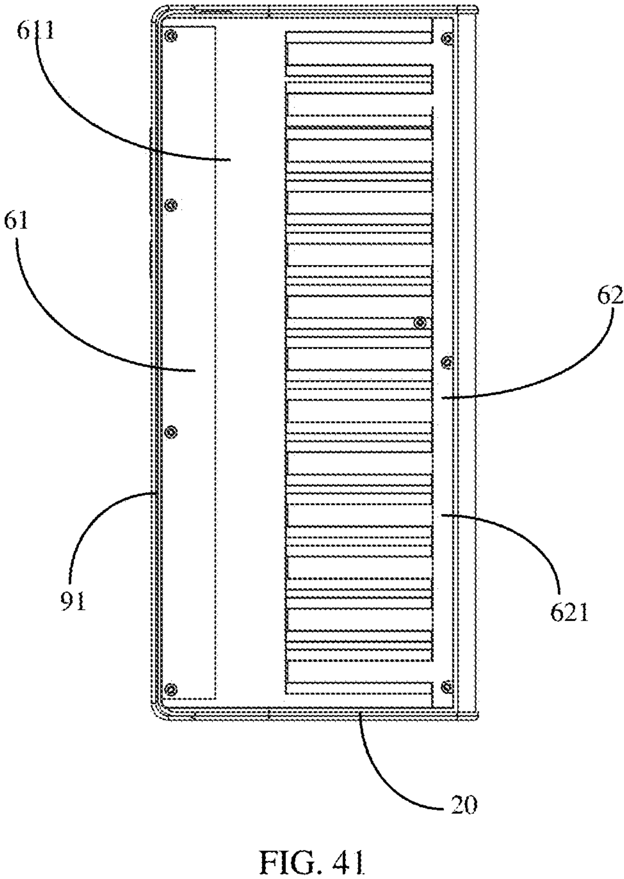
FIG. 41 is a schematic structural diagram of a supporting component of an electronic device in a retracted state according to an exemplary embodiment of the present disclosure.
Figure 42:
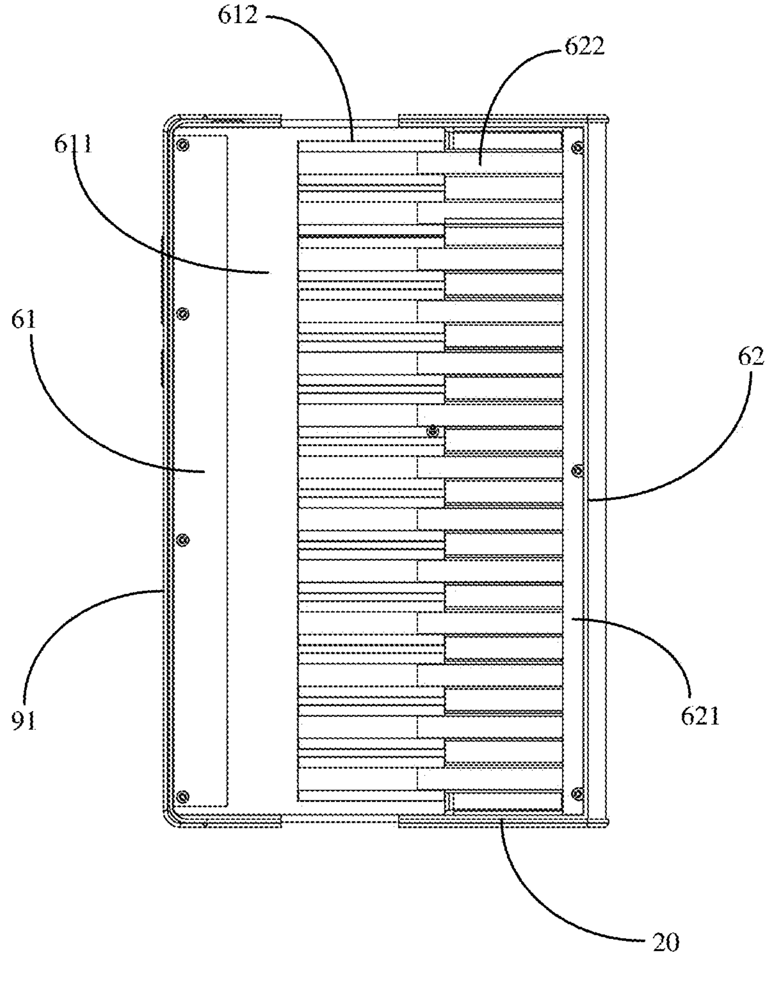
FIG. 42 and FIG. 43 are schematic structural diagrams of a supporting component of an electronic device in a stretched state according to an exemplary embodiment of the present disclosure.
Figure 43:
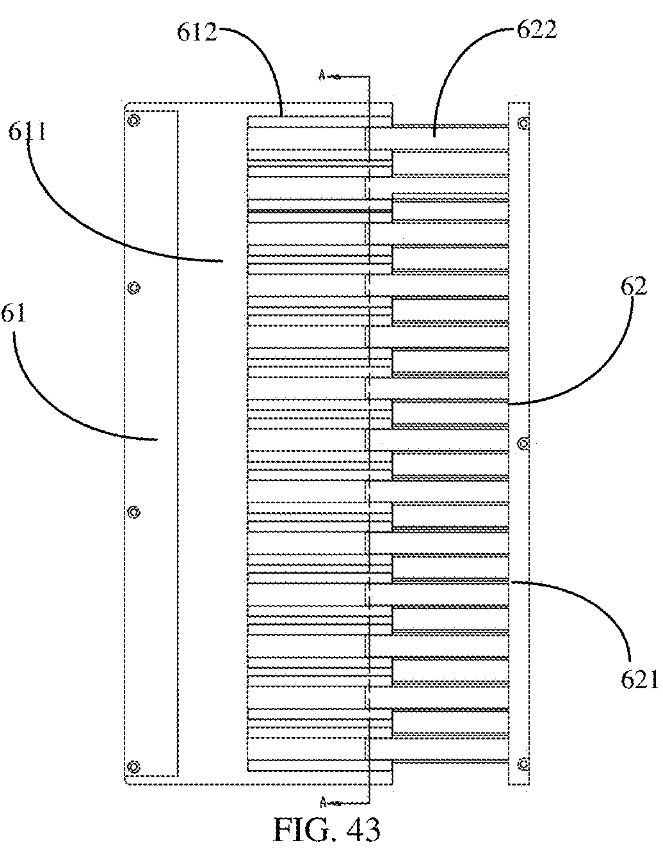

Referring to FIG. 34, in some implementations, the sub-support 121 includes a first holt hoop seat 1211 and a second holt hoop seat 1212 spliced with the first holt hoop seat 1211, the first holt hoop seat 1211 and the second holt hoop seat 1212 are hooped on two sides of the rotating shaft 122 and connected to each other, any one of the first holt hoop seat 1211 and the second holt hoop seat 1212 is fixedly connected to the bracket 11, and in the example shown in the figure, the second holt hoop seat 1212 is fixedly connected to the bracket 11. The sub-support 121 adopts a detachable structural form for splicing the first holt hoop seat 1211 and the second holt hoop seat 1212, which is convenient to detach and assemble.

Referring to FIG. 35 to FIG. 43, the electronic device of the present disclosure may further include a main control board 59 and a support component 60, and the main control board 59 may be connected to the driving mechanism 99 and the flexible display screen 90 as a main control end of the entire device for controlling the driving mechanism 99 and other components. A battery, the main control board 59, a front camera, a rear camera 97, an earpiece speaker 98, a driving motor, a driving circuit board and other stacked functional components are assembled to the first housing 91 of the middle frame component. The first housing 91 may be independently used as a middle frame housing, and an outer side of both the first housing 91 and the second housing 92 may be provided with a decoration piece 94, so as to protect and decorate.

The supporting component 60 includes a first supporting plate 61 supported below the flexible display screen 90 and a second supporting plate 62 slidably connected to the first supporting plate 61, the first supporting plate 61 is connected to the first housing 91, and the second supporting plate 62 is connected to the sliding rail mechanism. Optionally, the second supporting plate 62 is connected to the sliding rail component 20. Optionally, the first supporting plate 61 may be fixed on the first housing 91 by means of adhesive glue or spot glue or screw connection, and the second supporting plate 62 may be fixed on the sliding rail component 20 of the sliding rail mechanism by means of adhesive glue or spot glue or screw connection. A first end of the flexible display screen 90 may be fixed on the first supporting plate by means of adhesive glue or spot glue, so as to achieve better fixing effect.

The sliding rail mechanism moves relative to the first housing 91 along the first direction X to drive the second housing 92, the first end of the flexible display screen 90 and the second supporting plate 62 to move relative to the first housing 91, so that the flexible display screen 90 is switched between the stretched state and the retracted state. During a stretching process, the second supporting plate 62 slides relative to the first supporting plate 61 to support the stretched portion of the flexible display screen 90 relative to the first housing 91.

Through the above arrangement, the flexible display screen 90 is supported by the supporting component 60, and the sliding rail mechanism moves to drive the flexible display screen 90 to move, so as to realize stretching and retracting of the flexible display screen 90. In the stretching process, the sliding rail mechanism moves to drive the second supporting plate 62 to slide relative to the first supporting plate 61 to support the stretched portion of the flexible display screen 90 relative to the first housing 91, so as to comprehensively support the flexible display screen 90, thereby ensuring that the flexible display screen 90 is not depressed when the product is in the stretched state.

Figure 44:
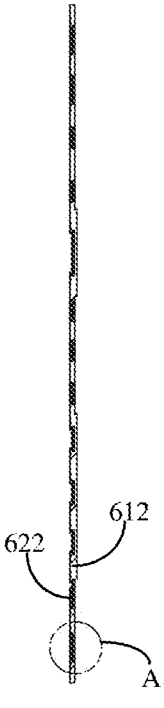
FIG. 44 is a cross-sectional view along plane A-A of FIG. 43.

Referring to FIG. 44, in some implementations, the first supporting plate 61 includes a first main body portion 611 and a plurality of guiding grooves 612 disposed on a side portion of the first main body portion 611, the first main body portion 611 is connected to the first housing 91, the plurality of guiding grooves 612 are spaced apart along a second direction perpendicular to the first direction X, and the guiding grooves 612 extend along the first direction X. The second supporting plate 62 includes a second main body portion 621 and a plurality of guiding rails 622 disposed on a side portion of the second main body portion 621, the second main body portion 621 is connected to the sliding rail mechanism, the plurality of guiding rails 622 are spaced apart in the second direction, the number of the guiding rails 622 is the same as the number of the guide grooves 612, and the guide rails 622 are slidably disposed in the guiding grooves 612 in one-to-one correspondence. It should be noted that, in other examples, positions of the guiding grooves and the guide rails may be exchanged, that is, a side portion of the first main body portion 611 is provided with a plurality of guiding rails, and a side portion of the second main body portion 621 is provided with a plurality of guiding grooves, and the guiding rails are still slidably disposed in the guiding grooves in a one-to-one correspondence manner, so that a function of slidably disposing the second supporting plate 62 relative to the first supporting plate 61 may also be implemented.

It can be understood that the first supporting plate 61 and the second supporting plate 62 of the supporting component 60 are supported at intervals in phase sequence, similar to a comb or a comb tooth structure of a comb head, and when the second supporting plate 62 slides relative to the first supporting plate 61, a distance between two supporting positions is reduced as much as possible, so that effect of supporting the flexible display screen 90 is better.

Figure 45:
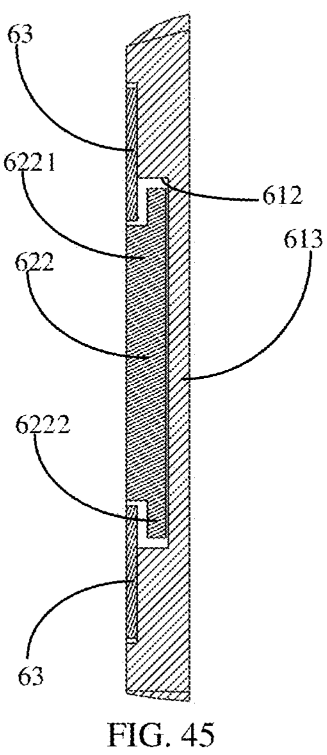
FIG. 45 is an enlarged schematic diagram of part A in FIG. 44.

Referring to FIG. 45, in some implementations, limiting pieces 63 are disposed on both sides of the opening of the guiding groove 612, and the limiting pieces 63 partially protrude from a side wall of the guiding groove 612. The guiding rail 622 includes a first portion 6221 and a second portion 6222 connected to the first portion 6221, and a surface of the first portion 6221 is flush with the two limiting pieces 63. The second portion 6222 is slidably disposed on the guiding groove 612, and two ends of the second portion 6222 are respectively located between a bottom wall of the guiding groove 612 and the protruding portion of the limiting piece 63. Optionally, the limiting piece 63 may be fixed at the opening of the guiding groove 612 by electric welding. The limiting piece 63 partially protrudes from the side wall of the guiding groove 612, which can limit the guiding rail 622 in the guiding groove 612, prevent the guiding rail 622 from moving away from the guiding groove 612, and improve an overall stability of the supporting component.

Optionally, the guiding groove 612 and the two limiting pieces 63 form a stepped groove. The guiding rail 622 includes a stepped structure engaged with the stepped groove, and adopts a stepped engaging structure, so that the guiding rail 622 can better slide in the guiding groove 612 without moving away from the guiding groove 612.

Figure 46:
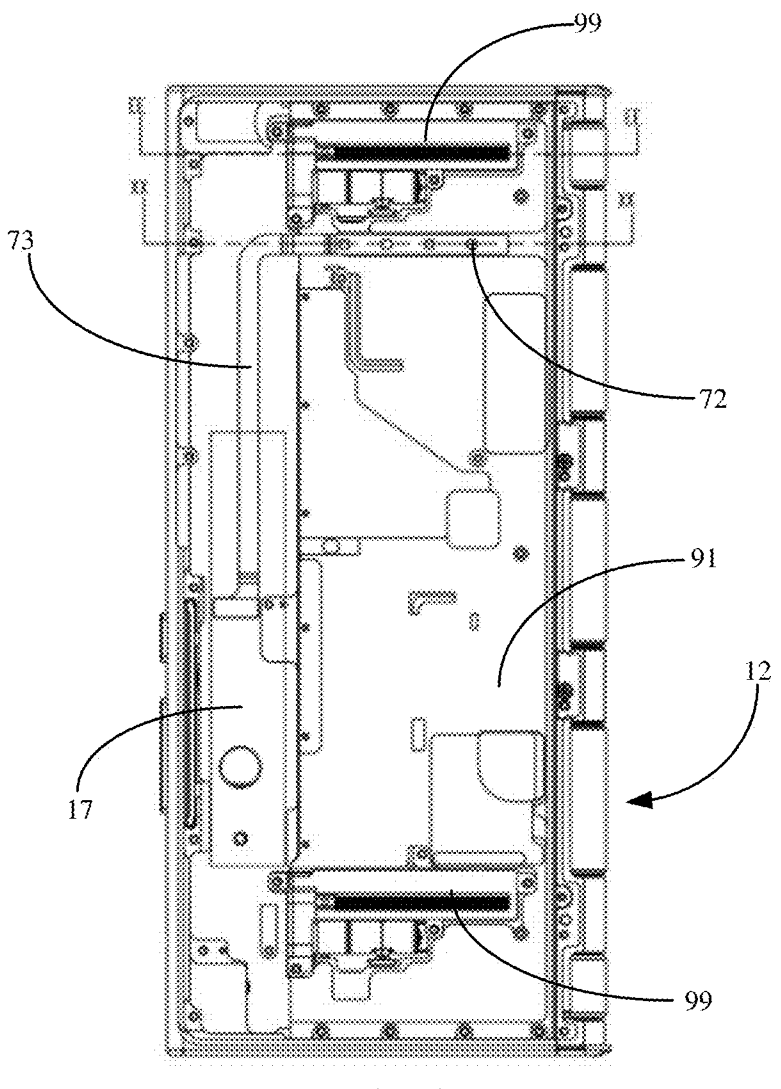
FIG. 46 is a schematic assembly diagram of a displacement sensor of an electronic device according to an exemplary embodiment of the present disclosure.
Figure 47:
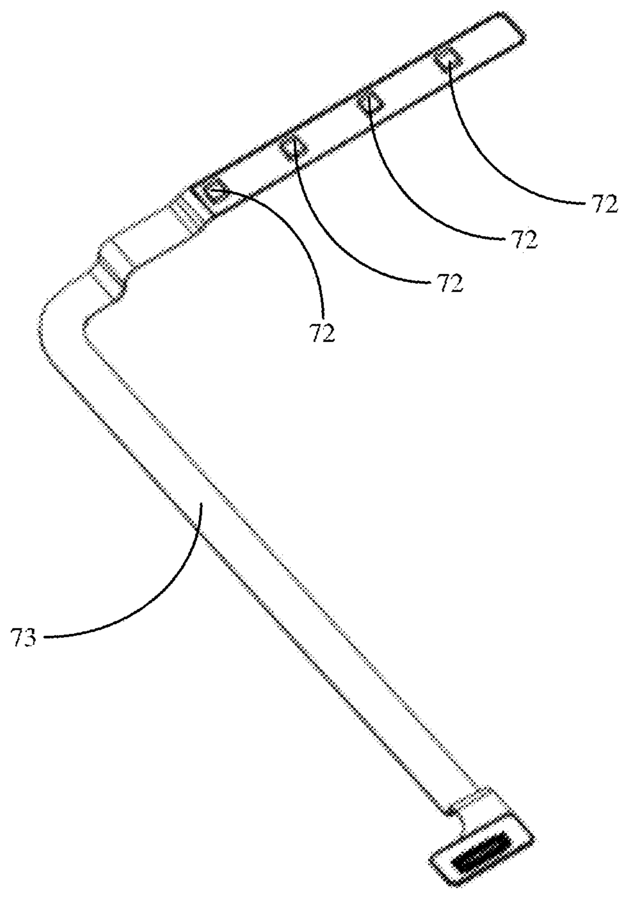
FIG. 47 is a schematic three-dimensional diagram of a displacement sensor of an electronic device according to an exemplary embodiment of the present disclosure.
Figure 48:
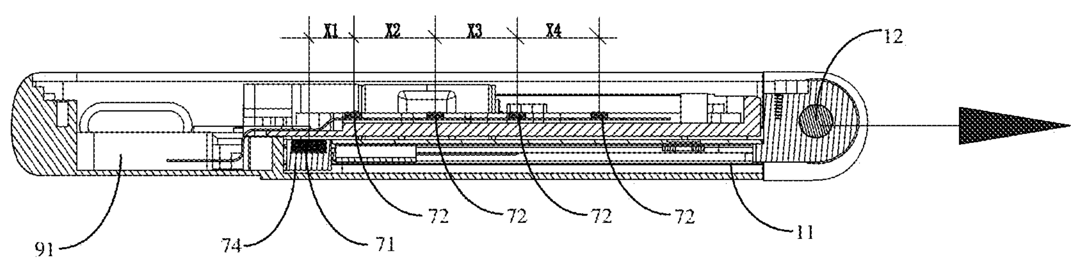
FIG. 48 is a cross-sectional view along plane XX-XX of FIG. 46.
Figure 49:
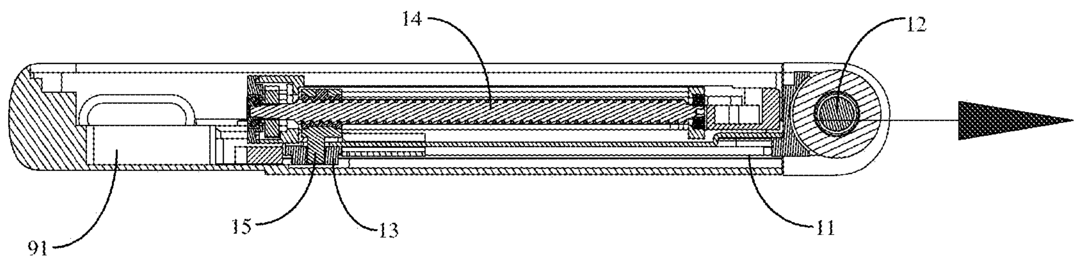
FIG. 49 is a cross-sectional view along plane EE-EE of FIG. 46.

Referring to FIG. 46, in some optional implementations, the electronic device of the present disclosure may further include a control mechanism, the control mechanism includes a displacement sensor and a controller electrically connected to the displacement sensor, and the displacement sensor is configured to measure a displacement variation of the sliding rail mechanism relative to the first housing 91. The controller is disposed in the first housing 91 and configured to control, according to the displacement variation, the driving mechanism 99 to drive the sliding rail mechanism to move along the first direction X by a first stroke. It can be understood that the driving mechanism drives the sliding rail mechanism to move along the first direction X, and drives the second housing 92, the sliding rail component 20, the first end of the flexible display screen 90, and the sliding member 22 to move relative to the first housing 91 along the first direction X, so that the flexible display screen 90 is switched between the retracted state and the stretched state. It can be understood that the displacement sensor is configured to measure a displacement variation of the bracket 11 of the sliding rail mechanism relative to the first housing 91, and the driving mechanism 99 drives the bracket 11 of the sliding rail mechanism to move in the first direction X, so as to drive the bracket 11, the second housing 92, and the first end 901 of the flexible display screen 90 to move in the first direction X relative to the first housing 91. In this embodiment, the number of the driving mechanisms 99 is two, and the driving mechanisms are symmetrically disposed on the first housing 91. The nuts of the two sets of driving mechanisms push the bracket to move outwards or retract relative to the first housing, and a balance of a push-out force is ensured by adopting the double driving mechanisms.

Through the above arrangement, the displacement variation of the sliding rail mechanism relative to the first housing 91 is measured by the displacement sensor, the controller can determine a first stroke of the sliding rail mechanism required to move along the first direction X according to the displacement variation, and output a control signal to the driving mechanism, and the driving mechanism drives the sliding rail mechanism to move along the first direction X according to the control signal to drive the flexible display screen 90 to move, thereby achieving a purpose of accurately controlling a moving stroke of the flexible display screen 90.

In some implementations, the displacement sensor includes a Hall magnet 71 and a plurality of Hall sensors 72 electrically connected to the controller, the Hall magnet 71 is disposed on one of the sliding rail mechanism and the first housing 91, and the plurality of Hall sensors 72 are disposed on the other one of the sliding rail mechanism and the first housing 91. In an example shown in FIG. 46, the Hall magnet 71 is disposed on the sliding rail mechanism, and the plurality of Hall sensors 72 are disposed on the first housing 91. The sliding rail mechanism moves relative to the first housing 91, and the plurality of Hall sensors 72 sense a magnetic field change of the Hall magnet 71 to obtain a displacement variation of the sliding rail mechanism relative to the first housing 91. Optionally, the Hall magnet 71 is disposed on the bracket 11 of the sliding rail mechanism.

It can be understood that the Hall sensor 72 may be a Hall chip, and a control principle of the controller is cooperation between the Hall chip and the Hall magnet, the Hall magnet is fixed on the bracket 11 of the sliding rail mechanism, the Hall magnet generates a magnetic field change, the Hall chip senses magnetic fields of different intensities, generates an electrical signal change, and sends the electrical signal change to the controller, and the controller determines, according to the electrical signal change, a displacement variation of the bracket of the sliding rail mechanism relative to the first housing, that is, a moved stroke of the bracket of the sliding rail mechanism relative to the first housing, and then calculates a first stroke of the bracket of the sliding rail mechanism that needs to move relative to the first housing, so as to control the driving mechanism to drive the bracket to move by the first stroke, thereby achieving a purpose of accurately controlling the moving stroke of the flexible display screen.

Referring to FIG. 46 to FIG. 49, in some implementations, the Hall magnet 71 is disposed in the sliding rail mechanism, and the plurality of Hall sensors 72 are disposed in the first housing 91 at intervals along the first direction X. Optionally, the Hall magnet 71 is disposed on the bracket 11 of the sliding rail mechanism. The number of the Hall sensors 72 is four, the intervals of the four Hall sensors 72 along the first direction X (i.e., an arrow direction shown in FIG. 48) are X1, X2, X3 and X4 respectively, meanwhile, different intervals are maintained between the Hall magnet 71 and the four Hall sensors 72 respectively, and these intervals needs to meet a sensing range of the Hall sensors. By arranging a plurality of Hall sensors to jointly sense the magnetic field change of the Hall magnet, the displacement variation of the bracket relative to the first housing can be calculated more accurately, so that the purpose of accurately controlling the moving stroke of the flexible display screen is achieved.

In some implementations, the displacement sensor further includes a sensor circuit board 73 disposed on the first housing 91, and the plurality of Hall sensors 72 are disposed on the sensor circuit board 73 at intervals along the first direction X. The driving mechanism includes a driving circuit board 17 electrically connected to the sensor circuit board 73. The controller includes a control circuit board electrically connected to the driving circuit board 17. Optionally, the sensor circuit board 73 may use an FPC (Flexible Printed Circuit) board to reduce occupied space. The control circuit board is electrically connected to the sensor circuit board 73 and is configured to receive data measured by the sensor circuit board 73. The control circuit board is electrically connected to the driving circuit board, and is configured to send a control signal to the driving circuit board.

It may be understood that the driving circuit board 17 is fixed to the first housing 91 of the middle frame housing, the Hall chip may be attached to the sensor circuit board 73, the sensor circuit board 73 is connected and fixed to the driving circuit board 17 by using a connector, and the sensor circuit board 73 is fixed to the first housing 91, that is, the middle frame bracket. The driving circuit board 17 is connected to the control circuit board through a flexible circuit board. The Hall magnet 71 is fixed on the bracket 11 by adhesive, the bracket 11 may be provided with an accommodating groove 74, and the Hall magnet 71 is embedded in the accommodating groove 74 to ensure the stability of the Hall magnet 71. When the driving mechanism drives the bracket 11 to move, the Hall magnet 71 moves along with the Hall magnet 71 to generate a varying distance from the Hall chip.

The bracket 11 of the sliding rail mechanism is fixedly connected with the second transmission member 15 of the driving mechanism, when the driving mechanism drives the bracket 11 to slide, a varying distance is generated relative to the Hall chip, the Hall magnet disposed on the bracket 11 of the sliding rail mechanism also generates a varying distance along with the movement of the bracket 11, an N/S pole of the Hall magnet forms a closed-loop magnetic field, and in a closed state of the sliding rail mechanism, the Hall chip is within a range of this magnetic field, so that the Hall chip generates a signal, where the signal is a position signal that can position the sliding rail mechanism being closed in place. When the Hall magnet moves outwards along with the side bracket, the magnetic field of the Hall magnet changes, the Hall chip determines a distance by which the bracket is pushed out through the magnetic field change, an electric signal is generated and transmitted to the controller (which can be understood as a CPU (central processing unit) of a terminal product), and the controller sends a control signal to the driving circuit board according to the signal to drive the driving motor to rotate or stop, so as to control a stroke by which the nut moves relative to the screw rod, a sliding stroke of the bracket is controlled thereby, and a purpose of accurately controlling the moving stroke of the flexible display screen is achieved.

In some implementations, the controller is further electrically connected to the flexible display screen 90, and is further configured to determine, according to a first stroke by which the sliding rail mechanism moves in the first direction X, a second stroke by which the flexible display screen 90 is stretched or retracted, and control a display size of the flexible display screen 90 according to the second stroke. It can be understood that, by receiving and sensing the signal change of the Hall chip, the controller controls a display size of the flexible display screen 90 according to the first stroke of the sliding rail mechanism moving along the first direction X and the second stroke, so as to control a display change of the flexible display screen 90, which can realize that the screen slides and displays at a same time, and can control a screen display ratio of any stroke to ensure display performance of the screen.

Other embodiments of the disclosure will be readily apparent to those skilled in the art upon consideration of the specification and practice of the applications disclosed herein. The present disclosure is intended to cover any variations, uses, or adaptations of the present disclosure, which follow the general principles of the present disclosure and include common or customary means in the art that are not disclosed in the present disclosure. The specification and embodiments are to be regarded as exemplary only, and the true scope and spirit of the present disclosure are indicated by the following claims.

It should be understood that the present disclosure is not limited to precise structures already described above and shown in the accompanying drawings, and various modifications and changes may be made without departing from the scope thereof. The scope of the present disclosure is limited only by the appended claims.

The invention claimed is:

1. An electronic device, comprising:

a housing, comprising a first housing and a second housing, wherein the first housing and the second housing encircle to define an accommodating structure comprising an opening;

a sliding rail mechanism, disposed in the accommodating structure and connected to the second housing, wherein the sliding rail mechanism is slidably connected to the first housing along a first direction;

a rotating shaft component, disposed at an end of the second housing away from the first housing, wherein the rotating shaft component comprises a track portion;

a thickness of the track portion along a third direction perpendicular to the first direction gradually decreases from an end close to the first housing to an end away from the first housing along the first direction; and a flexible display screen, disposed around the track portion, wherein a first end of the flexible display screen is connected to the sliding rail mechanism, and a second end of the flexible display screen is connected to the first housing and covers the opening, wherein the track portion comprises a track surface, the flexible display screen is disposed around the track surface, and an end surface of the track surface away from the first housing is an arcuate surface;

wherein the track portion comprises a track body and a rotating wheel, the track body is provided with an accommodating cavity, and the rotating wheel is movably disposed in the accommodating cavity; and the flexible display screen is disposed around the track body and a part of the rotating wheel, and an outer contour surface of the track body and a part of an outer contour surface of the rotating wheel form the track surface.

2. The electronic device according to claim 1, wherein the track surface is an elliptical surface.

3. The electronic device according to claim 1, further comprising a stretchable screen structure, wherein the stretchable screen structure comprises the flexible display screen and a supporting component;

wherein the flexible display screen is provided with a first magnetic component; the supporting component is supported below the flexible display screen, the supporting component comprises a first supporting plate and a second supporting plate, wherein the second supporting plate is connected to the flexible display screen, and is slidably connected to the first supporting plate; at least one of the first supporting plate or the second supporting plate is provided with a second magnetic component engaged with the first magnetic component; and the stretchable screen structure comprises a stretched state and a retracted state, when the stretchable screen structure switches between the stretched state and the retracted state, the second supporting plate slides relative to the first supporting plate along a direction away from or close to the first supporting plate, the flexible display screen and the second supporting plate move synchronously, and the second supporting plate is configured to support a part of the flexible display screen stretched relative to the first supporting plate.

4. The electronic device according to claim 3, wherein the first magnetic component comprises:

a first metal member, connected to a side of the flexible display screen close to the supporting component; and a second metal member, connected to the first metal member.

5. The electronic device according to claim 4, wherein the flexible display screen comprises a body portion and a bending portion connected to the body portion; the first metal member is non-magnetic, and is connected to a side of the body portion and a side of the bending portion close to the supporting component; the second metal member is magnetic, and is connected to a part of the first metal member within a region where the bending portion is located.

6. The electronic device according to claim 4, wherein:

the first metal member comprises a mesh metal sheet.

7. The electronic device according to claim 4, wherein the first supporting plate comprises a first body portion and first guiding portions disposed on a side portion of the first body portion, the first guiding portions are arranged to extend along the first direction, and are spaced apart along a second direction perpendicular to the first direction; and the second supporting plate comprises a second body portion and second guiding portions slidably engaged with the first guiding portions, the second guiding portions are disposed on a side portion of the second body portion, the second guiding portions are arranged to extend along the first direction, and are spaced apart along the second direction.

8. The electronic device according to claim 7, wherein the second magnetic component comprises at least one magnetic member, at least one of the second body portion or the second guiding portions is provided with a groove portion, and the magnetic member is provided in the groove portion.

9. The electronic device according to claim 8, wherein:

the second body portion is provided with a first groove portion, and the first groove portion is arranged to extend along the first direction.

10. The electronic device according to claim 9, wherein a number of magnetic members is multiple; and the second body portion is provided with at least two first groove portions spaced apart along the second direction.

11. The electronic device according to claim 7, wherein the first guiding portion comprises one of a guiding groove or a guiding rail engaged with each other, and the second guiding portion comprises the other one of the guiding groove or the guiding rail engaged with each other.

12. The electronic device according to claim 4, wherein:

the second metal member comprises a strip metal sheet.

13. The electronic device according to claim 8, wherein:

at least one of the second guiding portions is provided with a second groove portion, and the second groove portion is arranged to extend along the second direction.

14. The electronic device according to claim 9, wherein a number of magnetic members is multiple; and at least one of the second guiding portions is provided with at least two second groove portions spaced apart along the first direction.

15. The electronic device according to claim 9, wherein a number of magnetic members is multiple; and the second body portion is provided with at least two first groove portions spaced apart along the second direction, and at least one of the second guiding portions is provided with at least two second groove portions spaced apart along the first direction.

* * * * *